(12) United States Patent  
Saito

(10) Patent No.: US 6,636,060 B1
(45) Date of Patent: Oct. 21, 2003

(54) INSERT FOR ELECTRIC DEVICES TESTING APPARATUS

(75) Inventor: Noboru Saito, Tokyo (JP)

(73) Assignee: Advantest Corporation, Tokyo (JP)

( * ) Notice: Subject to any disclaimer, the term of this patent is extended or adjusted under 35 U.S.C. 154(b) by 198 days.

(21) Appl. No.: 09/617,432

(22) Filed: Jul. 14, 2000

(30) Foreign Application Priority Data

Jul. 16, 1999 (JP) ............................................. 11-203551
Jul. 16, 1999 (JP) ............................................. 11-203552

(51) Int. Cl.[7] .............................................. G01R 31/02
(52) U.S. Cl. ........................................ 324/755; 324/765
(58) Field of Search .................................. 324/754, 755, 324/758, 765, 73.1, 158.1; 439/70–73, 330–331, 342

(56) References Cited

U.S. PATENT DOCUMENTS 5,493,237 A * 2/1996 Volz et al. .................. 324/754
5,902,144 A * 5/1999 Hay ............................ 439/331
6,094,057 A * 7/2000 Hiruta et al. ................ 324/755
6,262,581 B1 * 7/2001 Han ............................ 324/755
6,353,326 B2 * 3/2002 Hembree et al. ........... 324/755
6,368,137 B1 * 4/2002 Orwoll ....................... 439/331
6,369,595 B1 * 4/2002 Farnworth et al. ......... 324/755

* cited by examiner

Primary Examiner—Kamand Cuneo
Assistant Examiner—Minh N. Tang
(74) Attorney, Agent, or Firm—Birch, Stewart, Kolasch & Birch, LLP

(57) ABSTRACT

An insert for an electric devices testing apparatus, including a latch portion for moving between a first position for holding over an upper surface of electric devices under test held on an insert in a second position receding from the upper surface of the electric devices under test, and a latch arm portion for rotatably supporting the latch portion on the insert body, wherein a tip of the latch portion and a rotation center of the latch arm portion are arranged at the first position on an approximately vertical line, the latch portion and the rotation center of the latch arm portion being offset in a plan view of the insert.

9 Claims, 29 Drawing Sheets

FIG. 28
BACKGROUND ART
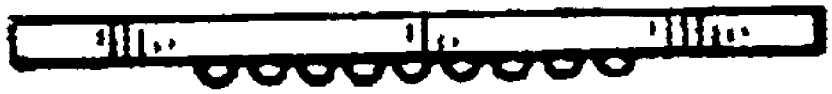

INSERT FOR ELECTRIC DEVICES TESTING APPARATUS

BACKGROUND OF THE INVENTION

1. Field of the Invention

The present invention relates to an electronic devices testing apparatus for testing a variety of electronic devices, such as semiconductor integrated circuit devices (hereinafter also simply referred to as an "IC" or "ICs"), a tray and an insert used therefor, more particularly relates to an insert, a tray and an electric devices testing apparatus superior in holding ICs under test and precisely positioning of the ICs under test with respect to a contact portion, wherein components are superior in being used widely.

2. Description of the Related Art

An electronic devices testing apparatus called a "handler" conveys a large number of ICs held on a tray to the inside of a testing apparatus where the ICs are electrically contact a test head, then the IC testing apparatus body (tester) is made to perform the test. When the test is ended, the ICs are conveyed out from the test head and reloaded on trays in accordance with the results of the tests so as to classify them into categories of good ICs and defective ones.

In an electric devices testing apparatus of the related art, there are some types wherein trays for holding the ICs to be tested or the tested ICs (hereinafter also referred to as "customer trays") and trays conveyed circulating inside the electric devices testing apparatus (hereinafter also referred to as "test trays") are different, therefore, in such types of electric devices testing apparatus, the ICs are switched between the customer trays and the test trays before and after the test, and in the testing processing wherein tests are carried out by pressing the ICs against the test head while being carried on the test trays.

In a test tray of an electric devices testing apparatus of the related art, for example 64 of IC mounting devices called inserts are provided, and the insert 16, as shown in FIG. 27, has a lever plate 162 approaching and receding from the insert body. The lever plate 162 is mechanically connected to a latch 163 to hold ICs (to prevent the ICs from jumping out), and the latch 163 becomes a closed state under unloaded condition as shown in an upper figure of FIG. 27 due to an elasticity of a not illustrated spring so as to prevent the ICs from jumping out while being conveyed. On the other hand, when the lever plate 162 is pulled down from the outside, the latch 163 opens as shown in the lower figure of FIG. 27 and the ICs can be carried in and carried out.

The contact portion of the test head is comprised by a plurality of retractable contact pins 51 provided by springs, and the tip is, when testing an IC of a ball grid array (BGA) type, made to be a conical indentation mating with the ball-shaped input-output terminal.

In an electric devices testing apparatus of the related art, positioning of ICs under test with the contact pins is carried out by using an outer circumferential shape of a package mold of the IC, but in an IC of a chip size package (CSP), etc., size precision of the package mold is extremely rough and positional accuracy of the outer circumferential shape and the solder balls is not always guaranteed. Therefore, when determining a position by the outer circumference of the IC package mold, the solder ball ends up being pressed in an deviated state against the contact pin and a sharp tip of the contact pin is liable to damage the solder ball.

Thus, the present inventors have developed an apparatus wherein a position is determined not by a package mold but by a solder ball itself. As a result, not only damaging, etc. of the solder ball is prevented, but an insert can be used in common even when an outer shape is different as far as an arrangement matrix of the solder balls is the same.

When mounting two kinds of ICs having different outer shapes but in the same arrangement matrix are mounted on one kind of inserts as shown in FIG. 28, however, holding by the above latch 163 becomes difficult.

Namely, when determining a position of an IC with respect to the insert 16 by the solder ball, since a height of the solder ball itself is extremely low, the IC may be out of a guide even by small vibration. Accordingly, it is required that a clearance z in the vertical direction between the latch 163 and the IC is made as small as possible, and it can be realized only by making the tip of the latch 163 shown in FIG. 27 a little longer.

However, when making the tip of the latch 163 longer, an opening/closing amount x becomes small at the time of opening the latch 163 as shown in a lower figure of FIG. 27, consequently, an IC of a large outer shape and an IC of a small outer shape as shown in FIG. 28 can not be held by a same latch 163.

Although, when a rotation angle of the latch 163, that is an amount of pulling down the lever plate 162, is made larger, the opening/closing amount x of the latch 163 also becomes large, it is difficult to increase the pulling down amount of the lever plate 162 due to a limitation of a test procedure of the handler. Also., the opening/closing amount x of the latch 163 becomes large by moving the rotation center of the latch 163 downward in the figure, however, when the rotation center of the latch 163 is lowered, the insert itself becomes larger downwardly, so it may interfere with other mechanisms while being conveyed to the test procedure, etc.

On the other hand, when testing a ball grid array (BGA) type IC, as shown in FIG. 29, the contact portion of the test head 104 is comprised of a plurality of retractable contact pins 51 provided by springs (not shown). The ends, as shown by the part B in FIG. 30, are formed with conical indentations 51a mating with the ball-shaped input-output terminals of the ICs (hereinafter also referred to as the "solder balls HB"). In an electric devices testing apparatus of the related art, positioning of the IC to be tested with the contact pin 51 was performed by using an outer circumferential shape of a package mold PM of the IC under test.

However, in an IC of a chip size package (CSP) etc., size precision of the package mold PM is extremely rough and positional precision of the outer circumferential shape and the solder balls HB is not always guaranteed. Therefore, when determining a position by the outer circumference of the IC package mold PM, as shown in C portion in FIG. 30, the solder ball HB ends up being pressed in a deviated state against the contact pin 51 and a sharp tip of the contact pin 51 is liable to damage the solder ball HB.

Even an IC with a precise size of the outer circumferential shape of the package mold PM is positioned by using the outer circumferential shape and even if the ICs have the same matrix of the solder balls, if the outer circumferential shapes are different, inserts of the test tray also have to be changed and the test cost is increased.

Furthermore, even in a case of ICs other than the chip size package, since the ICs under test are detached at a socket portion and temporarily positioned before being pressed against the contact pins 51 of the test head so as to prevent the contact pins 51 from damaging the solder balls HB, there has been a disadvantage that an index time of the IC testing apparatus becomes long.

SUMMARY OF THE INVENTION

An object of the present invention is to provide an insert, a tray and an electric devices testing apparatus superior in holding electric devices under test.

Also, another object of the present invention is to provide an insert for an electric devices testing apparatus superior in precisely positioning the ICs under test to a contact portion and having components able to be widely used.

To attain the above first object, according to a first aspect of the present invention, an insert is provided in a slightly movable state on a tray and is loaded with electric devices to be tested inside an electric devices testing apparatus, the insert comprising:

a latch portion for moving between a first position and a second position, the first position for holding the electric devices under test in said insert by covering over an upper surface of the electric devices with a clearance to prevent the electric devices from jumping out, and the second position for receding from the upper surface of said electric devices under test; and a latch arm portion for rotatably supporting said latch portion on an insert body;

wherein a tip of said latch portion and a rotation center of said latch arm portion are arranged at the first position in an approximately vertical line crossing the upper surface of the electric devices being held in the insert in a view from a side of said insert, wherein said latch portion and the rotation center of said latch arm portion are offset from each other in a plan view of said insert.

At this time, it is not particularly limited but, preferably, there is provided an elastic body for biasing on said latch arm in the moving direction of said latch portion to said holding position.

In the insert of the present invention, when holding and releasing the electric devices under test, since the latch portion and the rotation center of the latch arm portion are arranged approximately on the same straight line in a view from the side, the open/close amount (difference between a holding position and a receded position) of the tip of the latch portion becomes geometrically large even if the rotation angle of the latch arm portion is small. As a result, electric devices of different package shield sizes can be loaded on the same insert. Also, in the insert of the present invention, since the latch portion and the rotation center of the latch arm portion are offset in a plan view, the latch arm portion does not disturb at the time of carrying in and out the electric devices to and from the insert.

In the above invention, it is not specifically limited, but it may be configured that a point to which a force is applied on said latch arm portion is provided on the opposite side of said latch portion with respect to the rotation center of the latch arm portion, and an external force acts on said point via a lever plate provided on said insert body (see FIG. 6 and FIG. 11), or it may be configured that said point on said latch arm portion is provided on the opposite side of said latch portion with respect to the rotation center of the latch arm portion and an external force directly acts on said point (see FIG. 12).

To attain the above first object, according to the second aspect of the present invention, there is provided an insert to be provided slightly movable on a tray loaded with electric devices under test and for handling inside an electric devices testing apparatus, comprising:

a guide core provided movably on an insert body and loaded with said electric devices under test;

a latch mechanism having a latch portion for moving between the position of holding by covering over the upper surface of the electric devices under test held in said inserts and the position of receding from the upper surface of said electric devices under test, and a latch arm portion for rotatably supporting said latch portion on the insert body; and an interlocking mechanism for interlocking a movement of said guide core with respect to the insert body and a movement of said latch portion.

At this time, preferably, said interlocking mechanism moves said latch portion to a stand-by position after separating said guide core from said insert body. Also preferably, said interlocking mechanism makes said guide core close to said insert body after moving said latch portion to a holding position.

In the insert of the present invention, when holding and releasing the electric device by the latch mechanism, the guide core loaded with the electric device is also made to be close to or apart from the insert body.

Namely, when loading the electric devices, they are loaded in a state where the latch portion is moved to a receded position and the guide core is moved to a separate position, then, after moving the latch portion to the holding position, the guide core is made close to the insert body. Namely, since the guide core is at an apart position at least when the latch portion closes, the latch portion does not interfere with the electric devices even if the thickness of the electric devices is different.

Also, at the time of taking out the electric devices, the guide core is first made to be away from the insert body from the state where the latch portion is at the holding position and the guide core is at the close position, then the latch portion is moved to the receded position. Namely, since the guide core is at the apart position at least when the latch opens, the latch portion does not interfere with the electric devices even if the thickness of the electric devices is different.

In this way, according to the insert of the present invention, electric devices having different package mold thicknesses can be loaded on the same insert.

The electric devices under test applied to the present invention is not specifically limited and includes all types of electric devices, however, particularly, when it is applied to an electric device having a ball-shaped terminal, so called a ball grid array type IC, the effect is specially remarkable.

At this time, the insert of the present invention preferably comprises a guide for positioning the terminal of said electric device under test by contacting the same.

As explained above, not by positioning the package mold of the electric device under test, but by directly positioning the terminal itself to be pressed against the contact portion, the positioning accuracy of the terminal of the electric device under test with the contact portion remarkably improves and damaging on the terminal, etc. can be prevented.

Also, when the arrangement matrix of the terminals of the electric devices is the same, the insert can be used in common even if the shape of the package molds is different. Thus the cost for working time for producing exclusive parts and arranging for exchanges can be reduced.

As a guide of this kind, the shape, setting position, number, material, etc. are not specifically limited and all kinds are included as far as it has a function of positioning the terminal of the electric devices by contacting the same.

For example, as a guide, a hole to which a ball-shaped terminal of a ball grid array type IC fits in can be mentioned.

In this case, holes for all ball-shaped terminals to respectively fit in may be provided and holes for some of the ball-shaped terminals to respectively fit in may be provided. Furthermore, other than a method of fitting one ball-shaped terminal in one hole, it is possible to fit one end of a ball-shaped terminal and one end of another ball-shaped terminal in one hole. Note that the "hole" mentioned here includes not only a through hole penetrating the guide core but an indentation not penetrating the guide core.

To attain the above first object, according to the third aspect of the present invention, there is provided a tray having the above insert for carrying in and out the electric devices under test to and from a contact portion of a test head of an electric devices testing apparatus.

Furthermore, to attain the above first object, according to the fourth aspect of the present invention, there is provided an electric devices testing apparatus having the above tray for conducting a test by pushing the terminals of the electric devices under test against the contact portion of the test head.

(2-1) To attain the above second object, according to the fifth aspect of the present invention, there is provided an insert to be provided slightly movable on a tray loaded with electric devices under test and for handling inside the electric devices testing apparatus, comprising a first guide for positioning the terminal of said electric device under test by contacting the same and a guide core provided slightly movable on the insert body.

In the insert of the present invention, the package mold of the electric device under test is positioned but the terminal itself to be pushed against the contact portion is directly positioned by a first guide, so the positioning accuracy of the terminals of the electric devices with respect to the contact portion is remarkably improved and damaging of the terminals, etc. can be prevented.

In this case, since the first guide for positioning the terminal of the electric device to be tested is formed on the guide core provided slightly movable on the insert body, even when there is a loading error between the insert body and the terminal of the electric device to be tested, it can be absorbed by a precisely moving operation of the guide core.

As a result, a step of correcting positions of the electric devices under test before pushing against the contact portion becomes unnecessary, and an index time of the electric devices testing apparatus can be shortened.

Also, if the arrangement matrix of the terminals of the electric devices under test is the same, the insert can be commonly used even if the shape of the package molds is different. Thus, the cost for working time for producing exclusive parts and arranging for exchanges can be reduced.

Furthermore, even when the arrangement matrix of the electric devices under test is different, it is sufficient to change only the guide core and the insert body can be used in common, so the cost for producing exclusive parts can be reduced.

(2-2) It is not particularly limited in the above invention but preferably, said guide core comprises a second guide for positioning with a conveyer to pick up said electric device under test of said electric devices testing apparatus.

By positioning with a pick up conveyer of the electric devices testing apparatus by using the second guide, positioning accuracy can be secured between the pickup conveyer and the guide core regardless of the positional relationship (a positional error) of the tray body, insert body, etc. and the pick-up conveyer. Accordingly, if the electric device under test is accurately held by the pick-up conveyer, the electric device under test can be loaded on the correct position of the guide core. Also, if the electric device under test is accurately held by the guide core, they can be accurately held by the pick-up conveyer, so the electric devices under test can be accurately conveyed to the loading destination.

(2-3) Furthermore, it is not specifically limited in the above invention, but preferably, said guide core comprises a third guide for positioning with a contact portion of the test head of said electric devices testing apparatus.

By positioning with respect to the contact portion of the test head by using the third guide, positioning accuracy can be secured between the contact portion and the guide core regardless of the positional relationship (a positional error) of the tray body, insert body, etc. and the contact portion. Accordingly, the terminals of the electric devices under test can be pushed correctly against the contact portion and the damaging of the terminals, etc. can be prevented.

(2-4) It is not specifically limited in the above invention, but preferably, said second guide and said third guide are a common hole or a pin.

(2-5) The electric devices under test applied in the present invention is not specifically limited and all types of electric devices are included, but particularly, when it is applied to an electric device having a ball-shaped terminal, so called a ball grid array type IC, the effect is specially remarkable.

Also, in the first guide of the present invention, the shape, setting position, number, material, etc. are not specifically limited and all kinds are included as far as it has a function of positioning the terminal of the electric devices by contacting the same.

For example, as a first guide, a hole to which a ball-shaped terminal of a ball grid array type IC fits in can be mentioned. In this case, holes for all ball-shaped terminals to respectively fit in may be provided or holes for some of the ball-shaped terminals to respectively fit in may be provided. Furthermore, other than a method of fitting one ball-shaped terminal in one hole, it is possible to fit one end of a ball-shaped terminal and one end of another ball-shaped terminal in one hole. Note that the "hole" mentioned here includes not only a through hole penetrating the guide core but an indentation not penetrating the guide core.

(2-6) To attain the above second object, according to the sixth aspect of the present invention, there is provided a tray having the above insert for carrying in and out the electric devices under test to and from the contact portion of the test head of the electric devices testing apparatus.

(2-7) Furthermore, to attain the above second object, according to the seventh aspect of the present invention, there is provided an electric devices testing apparatus having the above tray for conducting a test by pushing the terminals of the electric devices under test against the contact portion of the test head.

In this case, a preciser for correcting positions of said electric devices under test before loading said electric devices under test on said tray is further provided and said preciser preferably comprises a fourth guide for positioning the terminal of said electric device under test by contacting the same; and a fifth guide for guiding portions other than the terminal of said electric device under test and matching the terminal of said electric device under test to said guide.

Furthermore, in this case, said preciser preferably has a sixth guide for-positioning with a conveyer for picking up said electric device.

The customer tray loaded with the electric devices under test often differs in the loading number, loading pitch, etc. in accordance with users, and at the time of reloading the electric devices loaded on the customer tray to a tray to be conveyed inside the electric devices testing apparatus, it is necessary to change the pitch. The preciser of the present invention is preferably used for this kind of pitch changing and position correction of the electric devices under test.

Particularly, in the present invention, when the electric device under test is loaded on the preciser, portions other than the terminal are guided by the fifth guide and the terminal of the electric device matches the fourth guide. Due to this, the electric device reloaded to the preciser is made to be in the right position and the electric devices being secured the positional accuracy is held by the pick-up conveyer by using the sixth guide, and the positional accuracy of holding is improved.

BRIEF DESCRIPTION OF THE DRAWINGS

These and other objects and features of the present invention will become clearer from the following description of the preferred embodiments given with reference to the attached drawings, in which:

FIG. 28 is a view from the side of an general ball grid array type IC;

DESCRIPTION OF THE PREFERRED EMBODIMENTS

Figure 1:
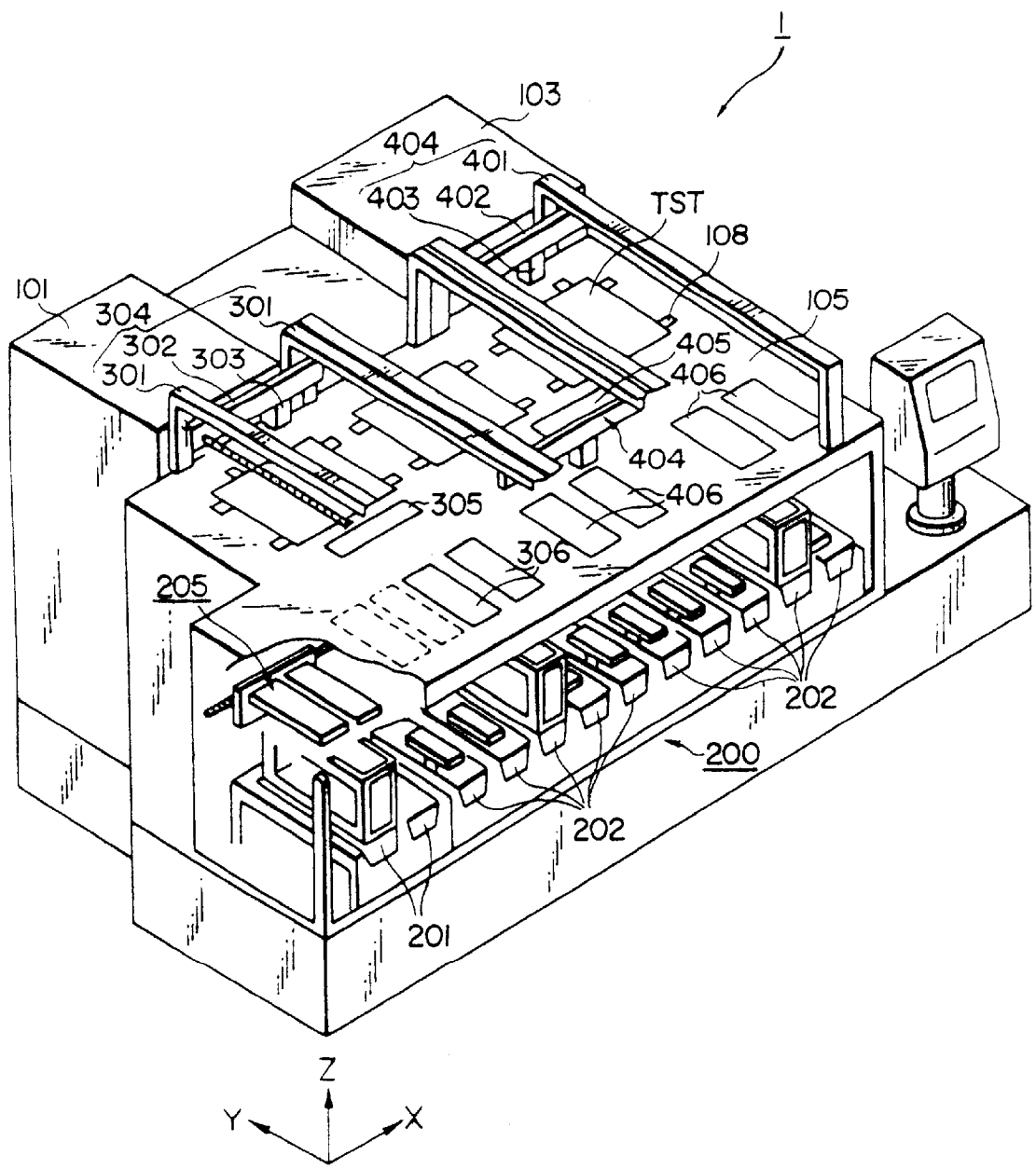
FIG. 1 is a perspective view of an embodiment of an electric devices testing apparatus of the present invention.
Figure 2:
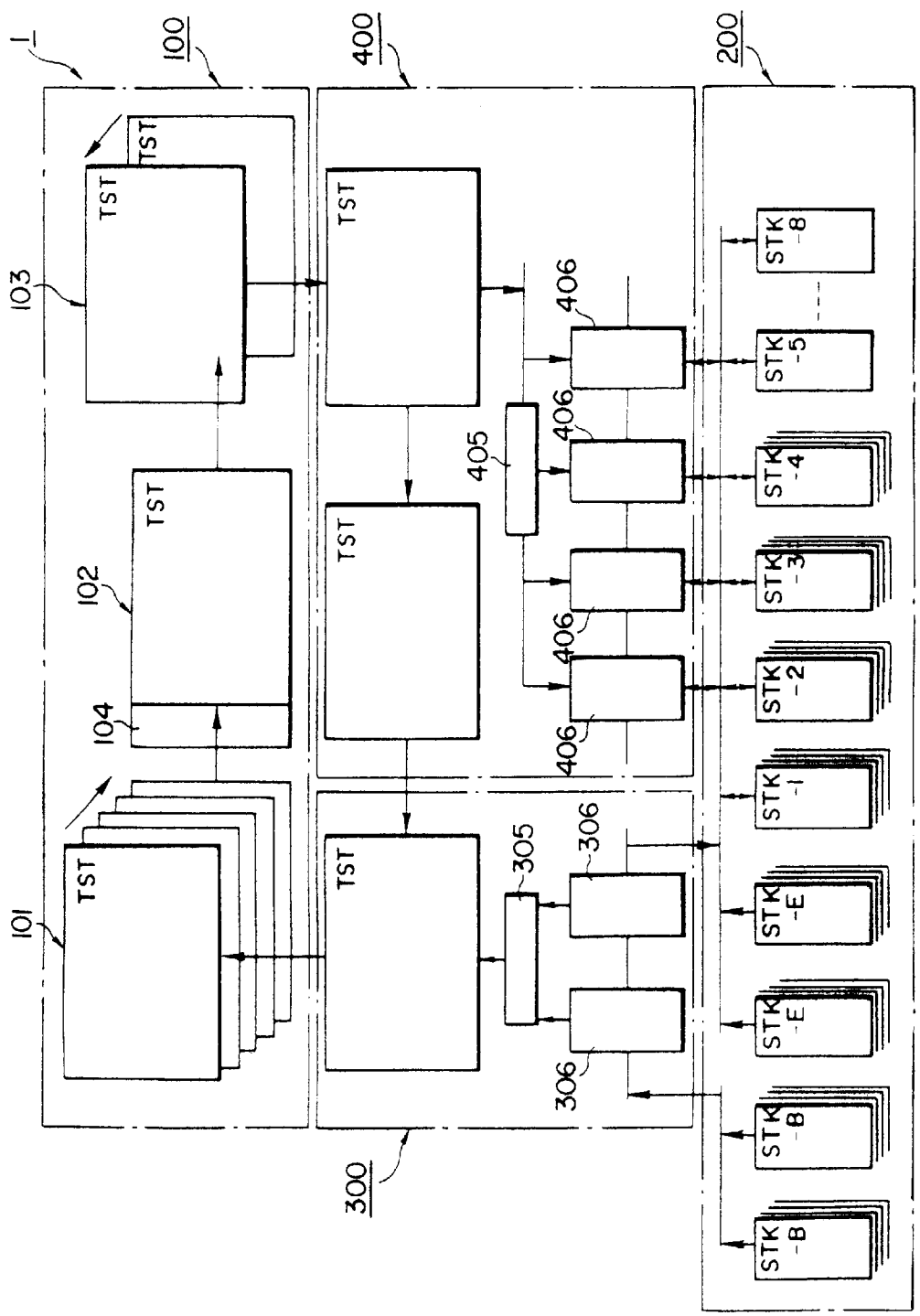
FIG. 2 is a flow chart of a tray showing a method of handling an electric device under test in the electric devices testing apparatus in FIG. 1.

FIG. 2 is a view for understanding a method of handling an IC to be tested (hereinafter, also simply referred to as an IC under test or an IC) in the electronic device testing apparatus of the present embodiment and partially shows by a plan view members actually arranged aligned in the vertical direction. Therefore, the mechanical (three-dimensional) structure will be explained with reference to FIG. 1.

First Embodiment

Figure 4:
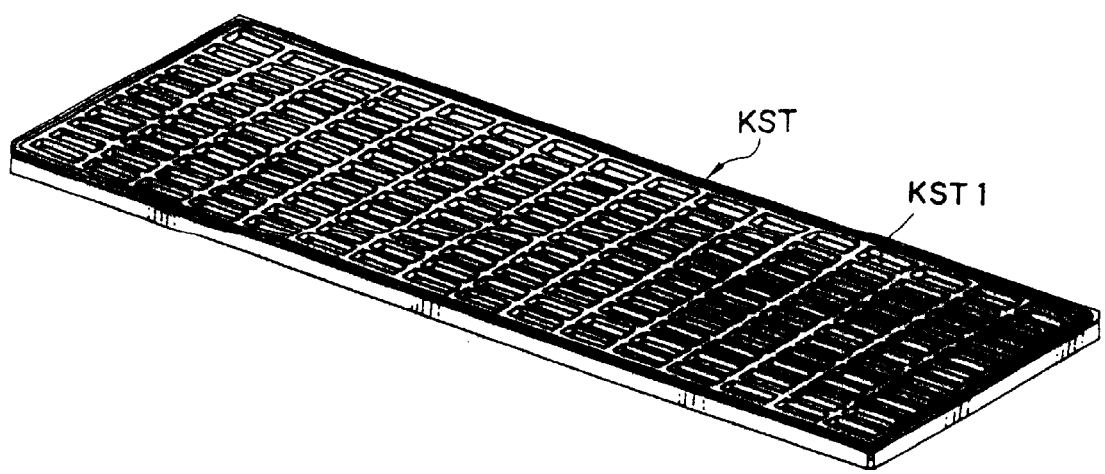
FIG. 4 is a perspective view of a customer tray used in the electric devices testing apparatus in FIG. 1.

The electronic devices tasting apparatus 1 of the present embodiment is an apparatus for testing (inspecting) whether an IC is operating suitably in a state applying a high temperature or low temperature thermal stress or no thermal stress to the IC, and classifies the ICs in accordance with the test results. The operating test in the state with thermal stress applied is performed by reloading the ICs from a tray carrying a large number of ICs to be tested (Hereinafter, also referred to as a customer tray KST. See FIG. 4.) to a test tray TST (See FIG. 5.) conveyed through the inside of the electronic devices testing apparatus 1.

For the above purposes, the electric devices testing apparatus 1 of the present embodiment comprises, as shown in FIGS. 1 and 2, an IC magazine 200 which holds the ICs to be tested or classifies and stores the tested ICs, a loader section 300 which sends the ICs sent from the IC magazine 200 into a chamber section 100, a chamber section 100 including a test head, and an unloader section 400 for classifying and taking out tested ICs which had been tested in the chamber section 100.

IC Magazine 200

The IC magazine 200 is provided with a pre-test IC stocker 201 for holding ICs to be tested and a post-test IC stocker 202 for holding ICs under test classified in accordance with the test results.

Figure 3:
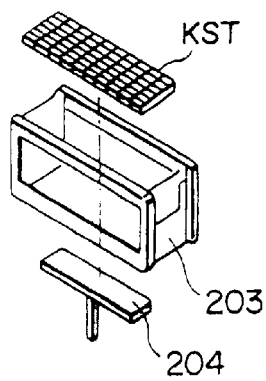
FIG. 3 is a perspective view of the configuration of an IC stocker of the electric devices testing apparatus in FIG. 1.

These pre-test IC stocker 201 and post-test IC stocker 202, as shown in FIG. 3, are each comprised of a frame-shaped tray support frame 203 and an elevator 204 able to enter from under the tray support frame 203 and move toward the top. The tray support frame 203 supports in it a plurality of stacked customer trays KST, and only the stacked customer trays KST are moved up and down by the elevator 204.

The pre-test IC stocker 201 holds stacked customer trays KST on which the ICs to be tested are held, while the post-test IC stocker 202 holds stacked customer trays KST on which ICs finished being tested are suitably classified.

Note that since the pre-test IC stocker 201 and the post-test IC stocker 202 are structured the same, the numbers of the pre-test IC stocker 201 and the post-test IC stocker 202 may be suitably set in accordance with need.

In the example shown in FIG. 1 and FIG. 2, the pre-test IC stocker 201 is provided with two stockers STK-B and provided next to that with two empty stockers STK-E to be sent to the unloader section 400, while the post-test IC stocker 202 is provided with eight stockers STK-1, STK-2, . . . , STK-8 and can hold ICs sorted into a maximum of eight classes according to the test results. That is, in addition to classifying ICs as good and defective, it is possible to divide the good ICs into ones with high operating speeds, ones with medium speeds, and ones with low speeds and the defective ICs into ones requiring retesting etc.

Loader Section 300

The above-mentioned customer tray KST is conveyed from the lower side of the test board 105 to an opening 306 of the loader section 300 by a tray transfer arm 205 provided between the IC magazine 200 and test board 105. Further, in the loader section 300, the ICs loaded on the customer tray KST are transferred once to a preciser 305 by an X-Y-conveyor 304. There, the mutual positions of the ICs are corrected, then the ICs transferred to the preciser 305 are reloaded on the test tray TST stopped at the loader section 300 using the X-Y conveyor 304 again.

The X-Y conveyor 304 reloading the ICs from the customer tray KST to the test tray TST, as shown in FIG. 1, is provided with two rails 301 laid over the top of the test board 105, a movable arm 302 able to move back and forth (this direction designated as the Y-direction) between the test tray TST and a customer tray KST by these two rails 301, and a movable head 303 supported by the movable arm 302 and able to move in the X-direction along the movable arm 302.

The movable head 303 of the X-Y conveyor 304 has suction heads (detailed illustration of which is omitted) attached facing downward. The suction heads move while drawing out air to pick up the ICs from the customer tray KST and reload the ICs on the test tray TST. For example, about eight suction heads are provided for the movable head 303, so it is possible to reload eight ICs at one time on the test tray TST.

Chamber Section 100

The above test tray TST is loaded with the ICs to be tested in the loader section 300 and then conveyed to the chamber section 100. The ICs are tested in the chamber section 100 in the state being carried on the test tray TST.

The chamber section 100 comprises a constant temperature chamber 101 for giving a desired high temperature or low temperature thermal stress to the ICs to be tested carried on the test tray TST, a test chamber 102 for making the ICs contact the test head 104 in a state given the thermal stress by the constant temperature chamber 101, and a soak chamber 103 for removing the given thermal stress from the ICs tested in the test chamber 102.

In the soak chamber 103, when a high temperature was applied in the constant temperature chamber 101, the ICs to be tested are cooled by blowing in air to return them to room temperature. Alternatively, when a low temperature of, for example, about −30° C. has been applied in the constant temperature chamber 101, it heats the ICs by hot air or a heater etc. to return them to a temperature where no condensation occurs. Next, the thus treated ICs are conveyed out to the unloader section 400.

As shown in FIG. 1, the constant temperature chamber 101 and soak chamber 103 of the chamber section 100 are arranged so as to project upward from the test chamber 102. Further, the constant temperature chamber 101 is provided with a vertical conveyor as shown schematically in FIG. 2. A plurality of test trays TST stand by supported by the vertical conveyor until the test chamber 102 becomes empty. Mainly while standing by, a high temperature or low temperature thermal stress is applied to the ICs.

The test chamber 102 has a test head 104 arranged at its center. A test tray TST is conveyed above the test head 104 and the ICs are tested by bringing their input-output terminals HB into electrical contact with the contact pins 51 of the test head 104. On the other hand, the test tray TST finished being tested is treated in the soak chamber 103 to return the temperature of the ICs to room temperature, then is discharged to the unloader section 400.

In front of the constant temperature chamber 101 and the soak chamber 103 is provided a test board 105 as shown in FIG. 1. This test board 105 has a test tray conveyor 108 mounted on it. The test tray TST discharged from the soak chamber 103 by the test tray conveyor 108 provided on the test board 105 is returned to the constant temperature chamber 101 through the unloader section 400 and the loader section 300.

Figure 5:
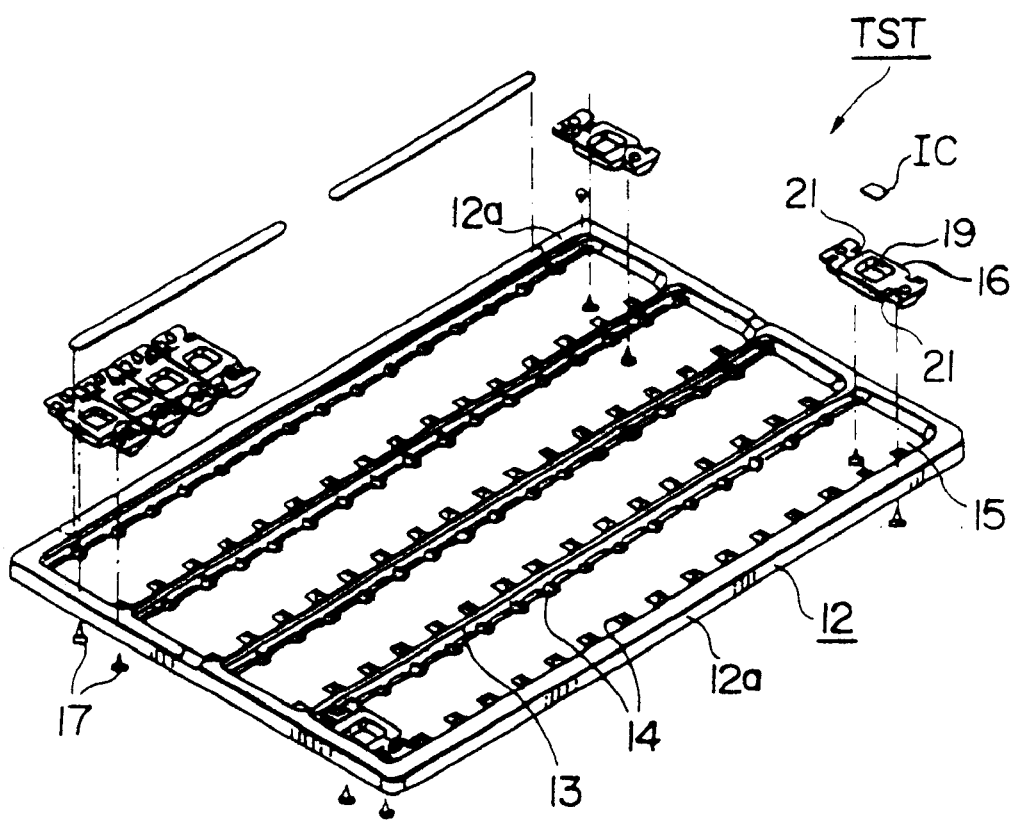
FIG. 5 is a partially disassembled perspective view of a test tray used in the electric devices testing apparatus in FIG. 1.

FIG. 5 is a disassembled perspective view of the structure of a test tray TST used in the present embodiment.

The test tray TST is comprised of a rectangular frame 12 provided with a plurality of crosspieces 13 in parallel at equal intervals and has a plurality of mounting pieces 14 formed projecting out at equal intervals at the two sides of these crosspieces 13 and the sides 12a of the frame 12 facing the crosspieces 13. Insert holders 15 are comprised between these crosspieces 13, between the crosspieces 13 and the sides 12a, and the two mounting pieces 14.

The insert holders 15 are designed to receive one insert 16 each. An insert 16 is attached to the two mounting pieces 14 in a floating state (able to move slightly) using fasteners 17. Therefore, mounting holes 21 to the mounting pieces 14 are formed at the two ends of the inserts 16. For example, about 16×4 of these inserts 16 are provided in one test tray TST.

Note that the inserts 16 are made the same shape and same dimensions and formed an IC holder 19 in which an IC to be tested is held. The detail will be explained later on.

Here, if the ICs connected to the test head 104 at a time are arranged in four rows and 16 columns as shown in FIG. 5, then for example four rows of four columns of ICs are simultaneously tested. That is, in the first test, the 16 ICs arranged every fourth column from the first column are tested connected to the contact pins 51 of the test head 104. In the second test,; the test tray TST is moved one column and the ICs arranged every fourth column from the second column are similarly tested. By doing this a total of four times, all of the ICs are tested (so called 16 simultaneous test). The results of the test are stored at addresses determined by for example the identification number assigned to the test tray TST and the numbers of the ICs assigned inside the test tray TST.

Figure 7:
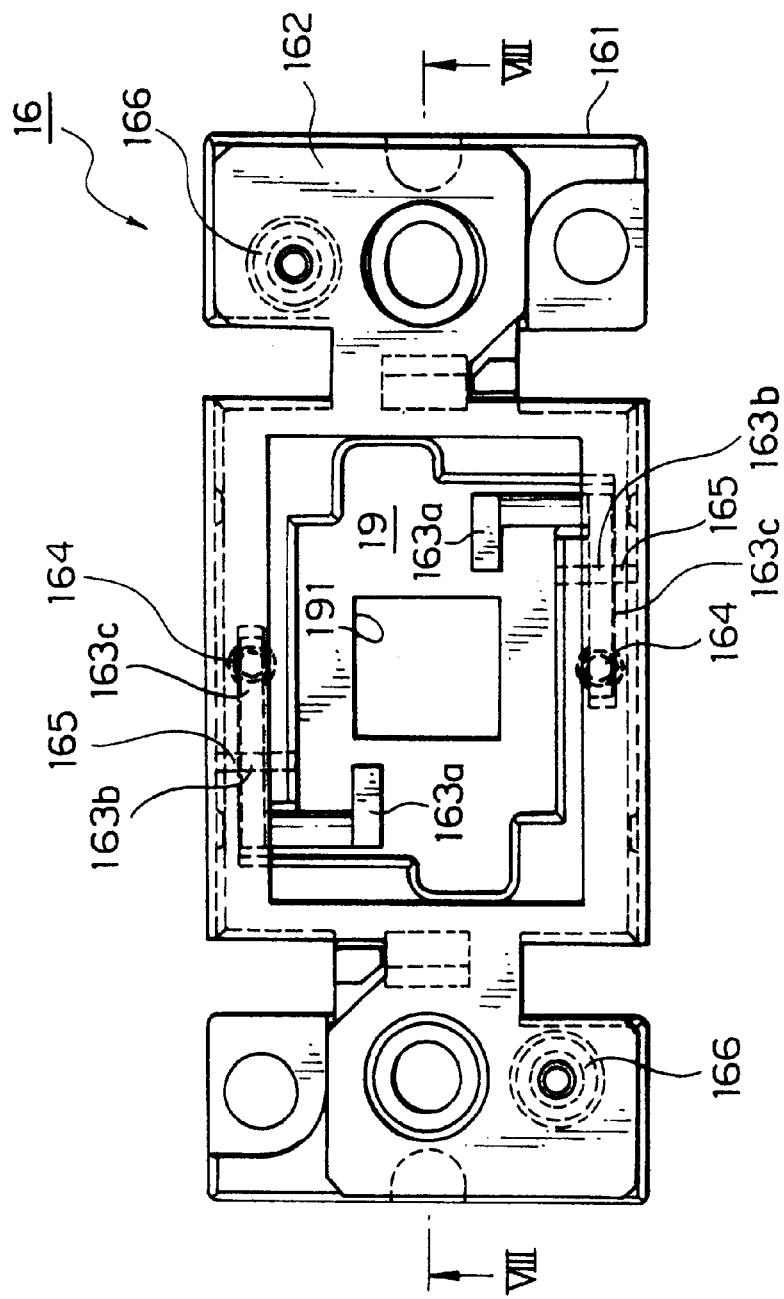
FIG. 7 is a plan view of the insert shown in FIG. 6.

A guide hall 191 (guides according to the present invention) formed by an opening shown in FIG. 7 is formed on the IC holder 19, and the guide halls 191 are formed corresponding to the positions of the solder balls HB of the ball grid array type ICs under test. Note that a small space is formed on the bottom surface of the IC holder 19 so that the solder balls HB can smoothly fit in the guide halls 191 without any difficulties as far as the arrangement matrix of the solder balls HB of the ICs under test is the same even if sizes of the outer circumferential surfaces of the package mold are somewhat different.

The guide hall 191 shown in the figure is configured as an opening so that only a solder ball HB at the outer-most circumference among solder balls HB of BGA type ICs fits in, however, other various forms may be considered for the guide of the present invention. For example, a large number of guide halls may be formed on the bottom surface of the IC holder 19 so that all solder balls HB of the BGA type ICs fit in and may be through holes so that the contact pins 51 can contact all the solder balls HB from the lower side. Also, guide halls 191 may be provided on the bottom surface of the IC holder 19 so that only solder balls HB on two rows from the outside among the solder balls HB of the BGA type ICs fit in, and an opening may be formed at a center of the bottom surface of the IC holder 19 so that the contact pins 51 can contact remaining solder balls HB.

Figure 6:
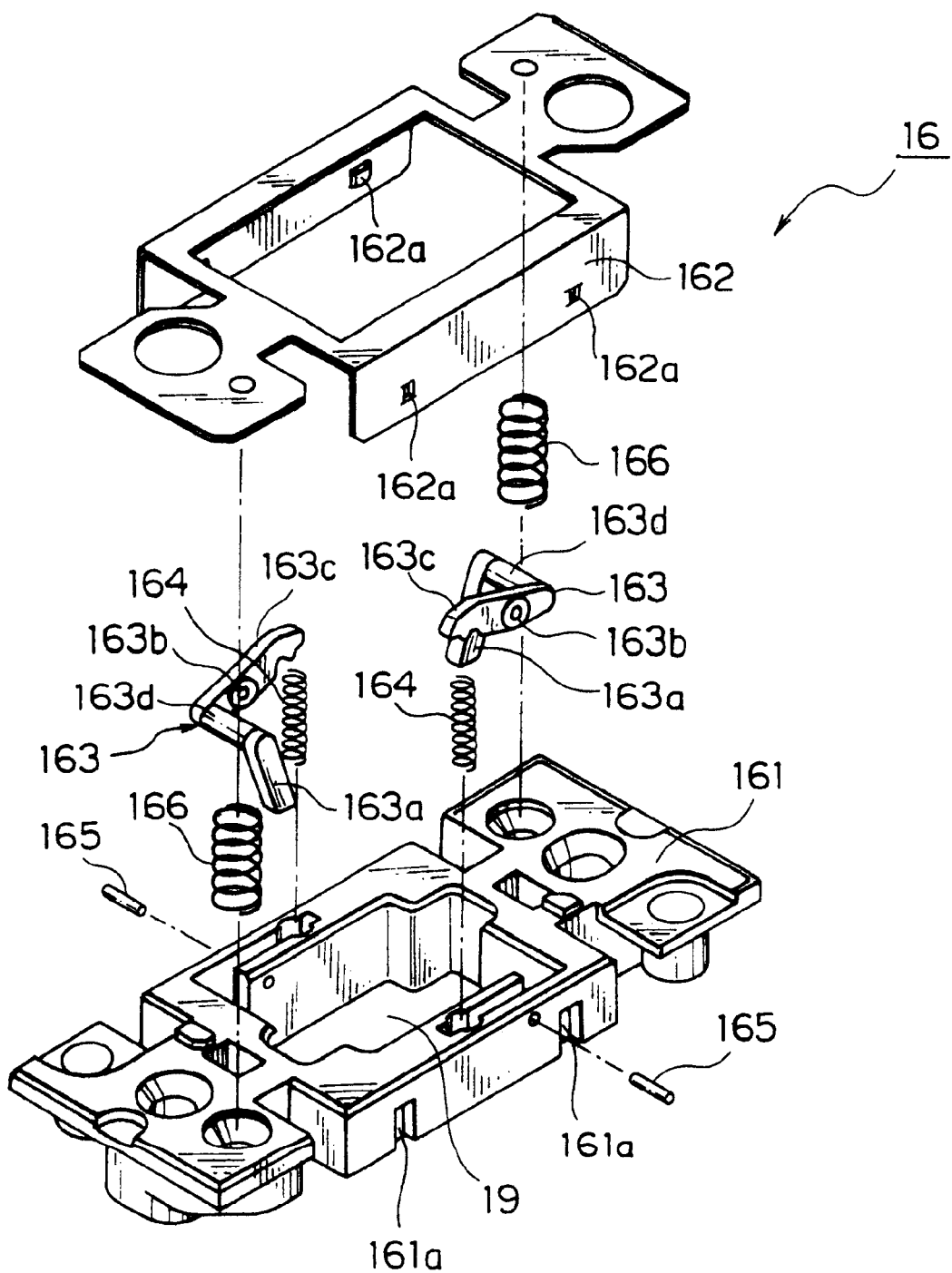
FIG. 6 is a disassembled perspective view of an embodiment of an insert of the present invention.

Particularly, the insert 16 of the present embodiment has a latch mechanism comprised of a latch 163, a coil spring 164 and a pin 165 shown in FIG. 6. The latch 163 of the latch mechanism is formed a latch portion 163a at one end, a latch arm portion 163d is connected thereto, and a point 163c to which a force is applied is provided on the latch arm portion 163d. Also, on the latch arm portion 163d between the latch portion 163a and the point 163c to which a force is applied is formed a through hole to be a rotation center 163b. By inserting a pin 165 therein, the latch 163 is rotatably supported by the insert body 161.

Figure 8:
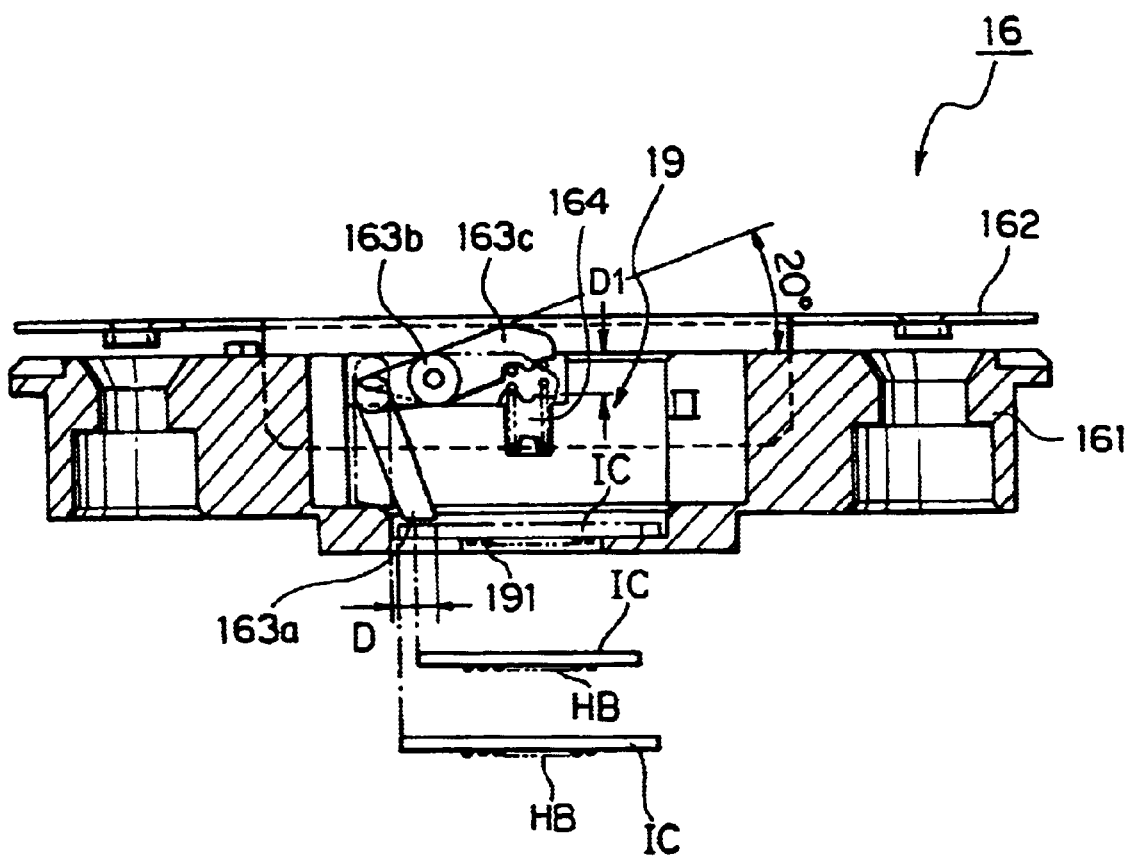
FIG. 8 is a sectional view (latch closed) along the line VIII—VIII in FIG. 7.
Figure 9:
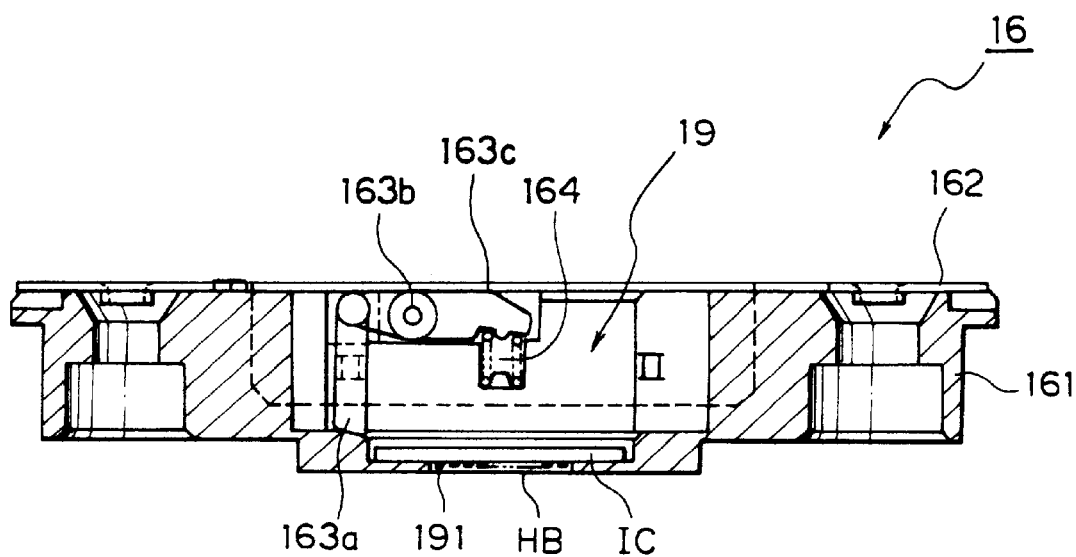
FIG. 9 is a sectional view (latch opened) along the line VIII—VIII in FIG. 7.

The latch portion 163a of the latch 163 is made to be able to move between the position of preventing the ICs from jumping out by covering the upper surface of the ICs carried by the IC holder 19 as shown in FIG. 8 (hereinafter, also referred to as a holding position or a closed position) and a position of enabling the ICs to be carried in and out by receding from the upper surface of the ICs as shown in FIG. 9 (hereinafter, also referred to as a receded position or an open position).

On the other hand, the point 163c to which a force is applied of the latch arm 163d contacts a later explained lever plate 162, an external force is applied on the point 163c as the lever plate 162 moves vertically and thereby, the latch 163 moves.

In the latch mechanism of the present embodiment, the tip of the latch portion 162a and the rotation center 163b of the latch arm 163d are arranged on an almost identical vertical line in the view from the side of the insert 16 shown in FIG. 8. As a result, even a vertical move of the lever plate 162 of about 1.5 mm can make the open-close move amount D of the tip of the latch portion 163a shown in FIG. 8 become large. Also, in the latch mechanism of the present embodiment, in a plan view of the insert 16 shown in FIG. 7, the latch arm portion 163d is provided on the latch portion 163a, that is, a position offset from the IC holder 19. Consequently, ICs can be carried in and out without any interferences on the IC holder 19. Note that the coil spring 164 mounted between the other end of the latch arm 163d and the insert body 161 is an elastic body for keeping the latch 163 at a holding position shown in FIG. 8 when the external force from the lever plate 162 is not applied, and during conveying the test tray TST, etc., the ICs become a state held by the latch portion 163a and are prevented from jumping out.

Figure 31:
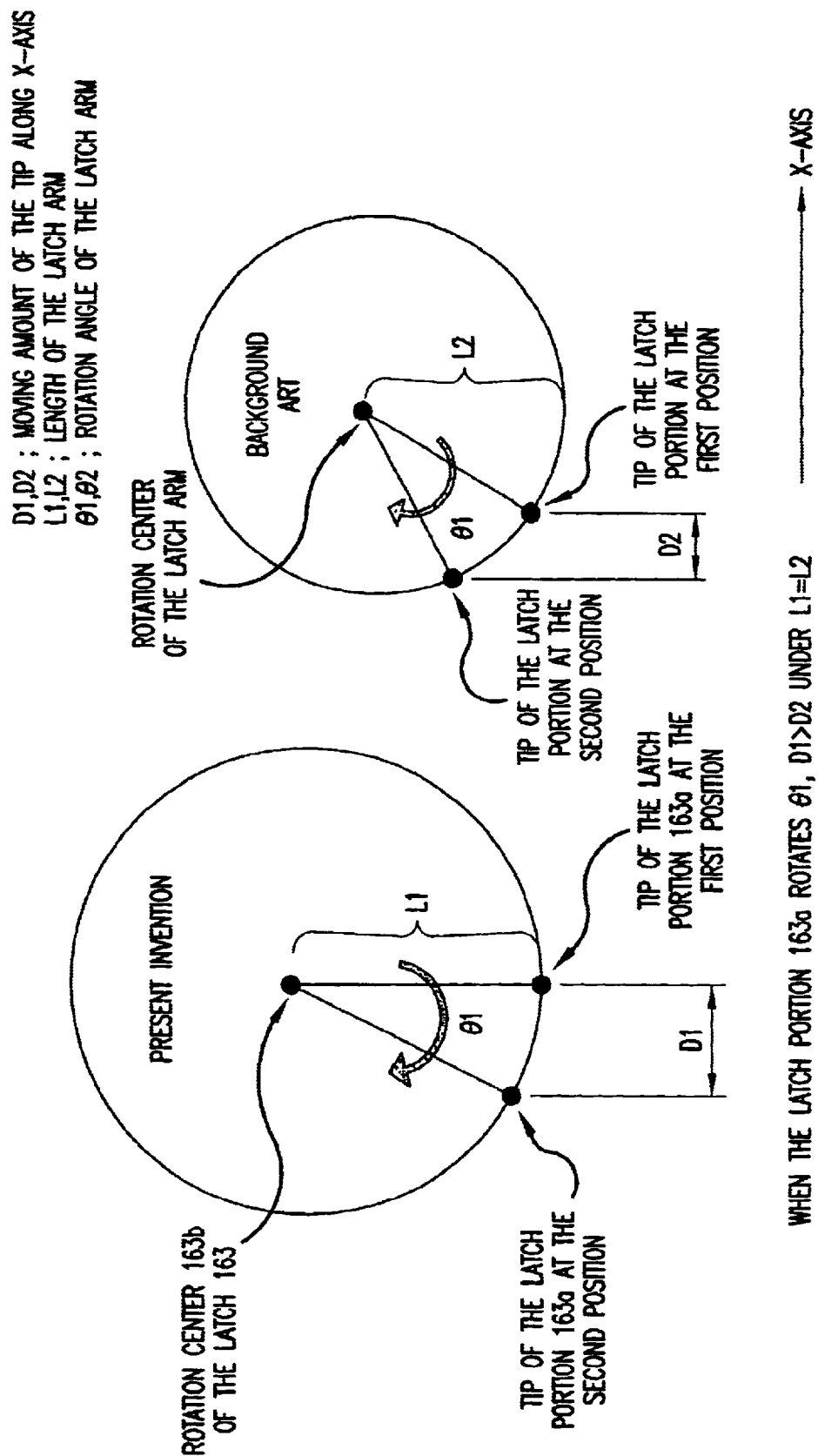
FIG. 31 illustrates the first and second portions of tip of the latch portion of the present invention as compared to positions of conventional devices.

FIG. 31 illustrates the first and second positions of the tip of the latch portion 163a of the present invention, as compared to positions of conventional devices, in which θ1 designates the angle of rotation around the rotation center 163b, and D1 designates the distance between the first and second positions the tip of the latch of portion 163a. The first position of the tip of the latch portion 163a of the insert 16 can be seen in FIG. 8, and the second position of the tip of the latch portion 163a of the insert 16 can be seen in FIG. 9.

The lever plate 162 provided on the insert 16 is biased to be an elevating position shown in FIG. 8 by the coil spring 166 provided between the insert body 161 and the upper limit of the elevating position is regulated by fitting the convex portion 162a formed on the lever plate 162 and the concave portion 161a formed on the insert body 161.

Figure 10:
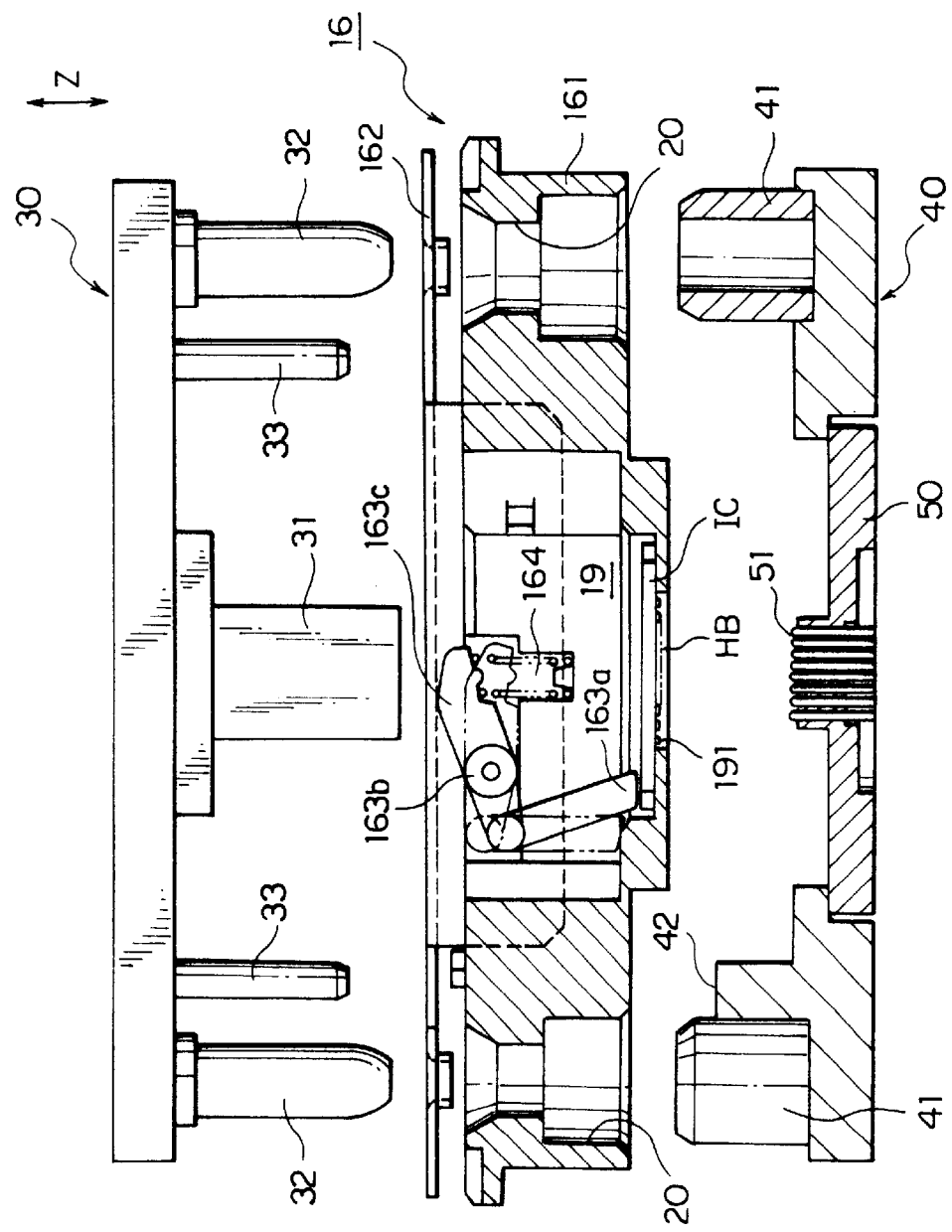
FIG. 10 is a sectional view of the configuration of a pusher, insert, socket guide and contact pin in the test head in FIG. 1.

FIG. 10 is a sectional view of the configuration of a socket 50 comprising a pusher 30, insert 16 (on the test tray TST side), socket guide 40 and contact pin 51 in the test head 104 of the electric devices testing apparatus, wherein the pushers are provided on at the upper side of the test head 104 and moved vertically in the Z-axis direction by a not shown Z-axial drive (for example, a fluid pressure cylinder). The pushers 30 are attached to the Z-axial drive corresponding to the intervals of the ICs to be tested at one time (in the above test tray, total sixteen of four rows every four columns).

A pusher 30 has formed at its center a rod 31 for pushing the IC. On the both sides thereof are provided with guide pins 32 to be inserted into guide holes 20 of the insert 16 mentioned later and the guide bushes 41 of the socket guide 40. Further, between the rod 31 and the guide pins 32 is provided a stopper guide 33 for limiting the descent of the pusher 30 lowered by the Z-axial drive as a lower limit. This stopper guide 33 abuts against the stopper surface 42 (only one side is shown) of the socket guide 40 to determine the lower limit position of the pusher for f pushing by a suitable pressure not breaking the IC.

The insert 16, as explained with reference to FIG. 5, ii is attached to the test tray TST using a fastener 17. On the both sides thereof are formed guide holes 20 through which the above-mentioned guide pins 32 of the pusher 30 and the guide bushes 41 of the socket guide 40 are inserted from above and below, respectively. In the state of descent of the pusher 30 the guide hole 20 at the left side in the figure is made a small diameter at its upper half where the guide pin 32 of the pusher 30 is inserted for positioning and is made a large diameter at its lower hole where the guide bush 41 of the socket guide 40 is inserted for positioning. Note that the guide hole 20 at the right side in the figure fits with play with the guide pin 32 of the pusher 30 and the guide bush 41 of the socket guide 40.

On the other hand, the socket guide 40 fixed to the test head 104 is provided at its two sides with guide bushes 41 for insertion of the two guide pins 32 of the pusher 30 and positioning with these two guide pins 32. The guide bush 41 at the left side also performs positioning with the insert 16.

At the lower side of the socket guide 40 is fixed a socket 50 having a plurality of contact pins 51. These contact pins 51 are biased in the upward direction by not shown springs. Therefore, even if pushing an IC, the contact pins 51 will retract to the top surface of the socket 50. On the other hand, it is possible for the contact pins 51 to contact all of the terminals HB even if the ICs are pushed somewhat at an angle.

Unloader Section 400

The unloader section 400 is provided with X-Y conveyors 404, 404 of the same structure as the X-Y conveyor 304 provided at the loader section 300. The X-Y conveyors 404, 404 reload the post-test ICs from the test tray TST carried out to the unloader section 400 to the customer tray KST.

The board 105 of the unloader section 400 is, as shown in FIG. 1, provided with two pairs of openings 406, 406 arranged so that the customer trays KST carried to the unloader section 400 can be brought close to the top surface of the board 105.

While not illustrated, an elevator table for elevating or lowering a customer tray KST is provided below the openings 406. A customer tray KST becoming full after being reloaded with the tested ICs is placed on here and lowered and the full tray is passed to the lower tray magazine of the tray transfer arm 205.

Note that in the electronic devices testing apparatus 1 of the present embodiment, while there are a maximum of eight types of sortable categories, it is only possible to arrange a maximum of four customer trays KST at the openings 406 of the unloader section 400. Therefore, there is a limit of four sortable categories in real time. In general, four categories are sufficient, i.e., good ICs can be classified into high speed response devices, medium speed response devices, and low speed response devices plus defective devices, but there may also arise categories not belonging to these categories such as devices requiring retesting.

In this way, when ICs arise which are classified into a different category than the categories given to four customer trays arranged at the openings 406 of the unloader section 400, one customer tray KST may be returned from the unloader section 400 to the IC magazine 200 and a customer tray KST to hold ICs of the newly arising category may be transferred to the unloader section 400 in its place so as to hold these ICs. If customer trays KST are switched in the middle of sorting work, the sorting work has to be interrupted during that time and therefore there is the, problem of a reduction in the throughput. Therefore, in the electronic devices testing apparatus 1 of the present embodiment, a buffer section 405 is provided between the test tray TST and the opening 406 of the unloader section 400, and ICs of a category rarely appearing are stored temporarily at this buffer section 405.

For example, the buffer section 405 is given a capacity able to hold 20 to 30 or so ICs and a memory is provided for storing the category of ICs held at the IC holding locations of the buffer section 405. The categories and positions of the ICs temporarily stored at the buffer section 405 are stored for each IC. In the intervals of the sorting work or when the buffer section 405 has become full, customer trays KST of the categories to which the ICs stored at the buffer section 405 belong are called up from the IC magazine 200 and the ICs are loaded on these customer trays KST. At this time, sometimes the ICs temporarily stored at the buffer section 405 span several categories, but at this time it is sufficient to call up several customer trays KST at one time from the openings 406 of the unloader section 400 when calling up customer trays KST.

Next, an operation of the insert 16 will be explained with reference mainly to FIG. 8 and FIG. 9.

A case of taking out ICs carried on the test tray TST by using for example an X-Y conveyer 304 will be explained as an example. FIG. 8 is a state ICs to be tested are carried on the test tray TST. When suction heads of the X-Y conveyer 304 approach the inserts 16 in this state, a part of the suction head pushes down the lever plate 162. Along with this, the point 163c to which a force is applied is also pushed down and the latch arm portion 163d rotates clockwise in the figure setting the rotation center 163b as a center. It is about 20 degrees in the present embodiment.

The state is shown in FIG. 9. The latch portion 163a moves to a position completely receded from the upper surface of the ICs, so that the ICs can be held by the suction heads. Note that an IC of a large device size and an IC of a small device size are shown in FIG. 8, but even if the size of the packages differs, any ICs can be held completely by the latch portion 163a of the present example as far as they have the same arrangement matrix of the solder balls HB as shown in the figure.

Figure 11:
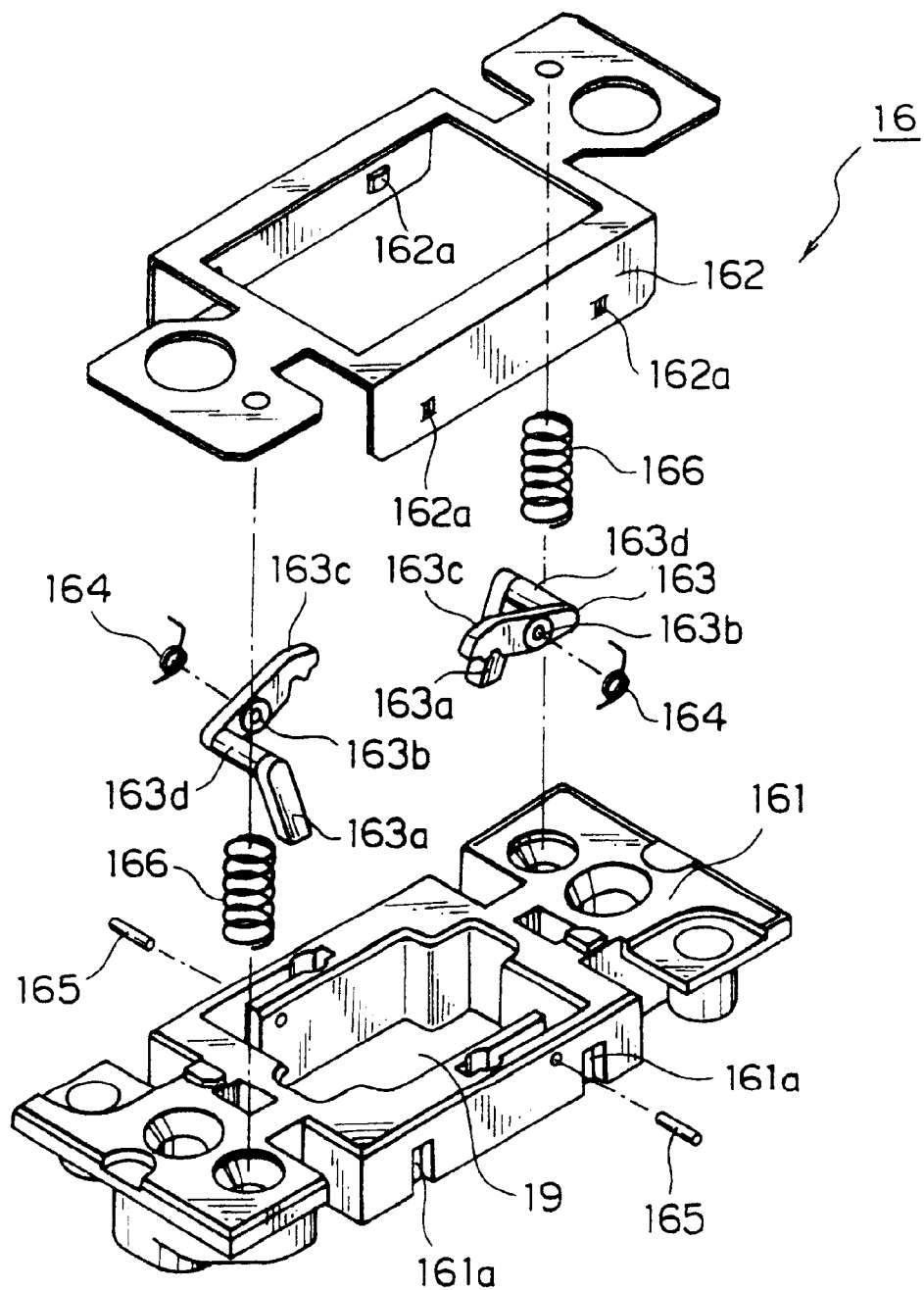
FIG. 11 is a disassembled perspective view of another embodiment of the insert of the present invention.
Figure 12:
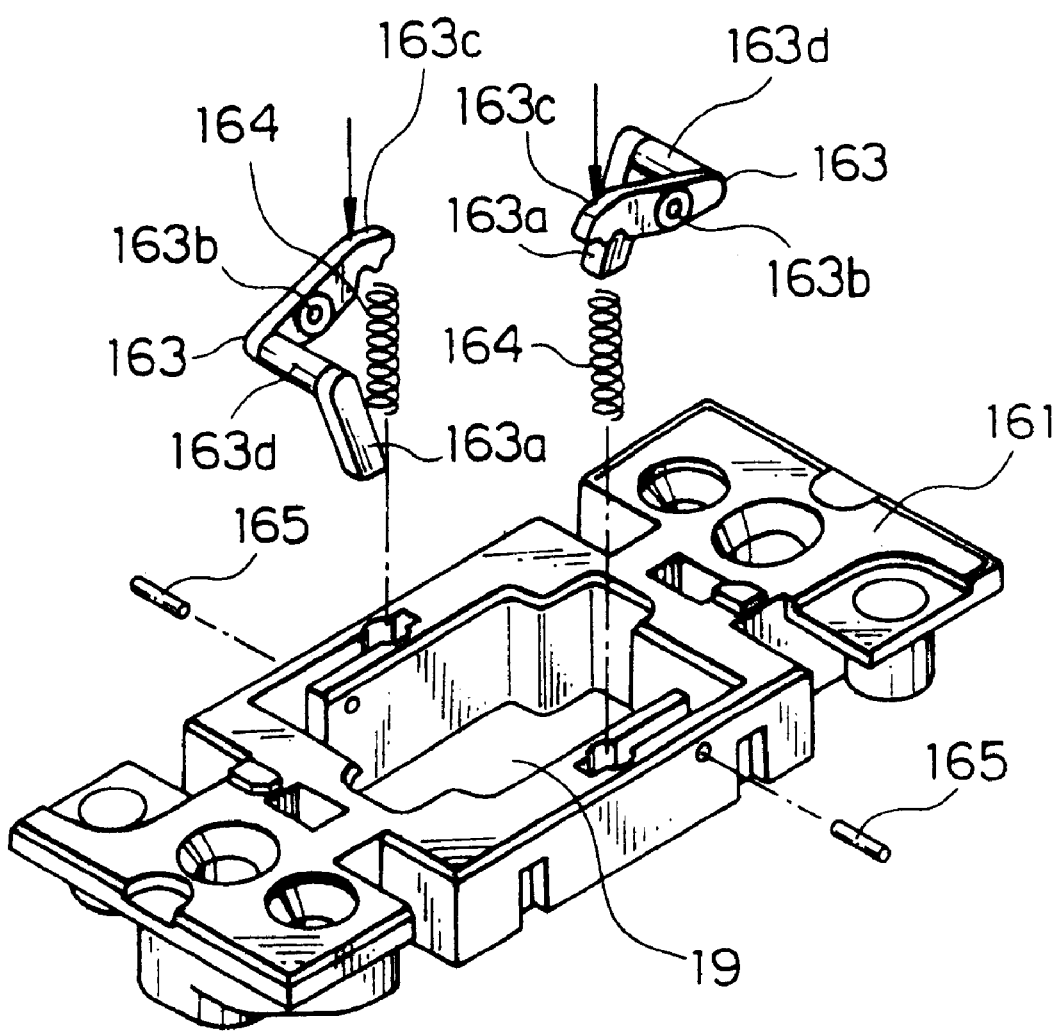
FIG. 12 is a disassembled perspective view of still another embodiment of the insert of the present invention.

FIGS. 11 and 12 are modification examples of the first embodiment. The insert 16 in FIG. 11 uses binding spring 164 as an elastic body mounted between the latch arm portion 163d and the insert body 161 and is mounted the same at the rotation center 163b. Also, the insert shown in FIG. 12 is configured to omit the lever plate 162 and wherein the point 163c to which a force is applied on the latch arm portion 163d is directly pushed down. Configuration other than that is identical with those in the above FIG. 6, so the same reference numbers are used and explanation therefor will be omitted.

Second Embodiment

According to the insert 16 of the above first embodiment, ICs of a large device size and ICs of a small device size as shown in FIG. 8 can be mounted on the same insert 16. Furthermore, since a clearance between the tip of the latch portion 163a and the upper surface of the ICs can be made as small as possible, positioning by solder balls HB does not end up deviating from the guide holes 191.

In the insert of the above first embodiment, however, when loading ICs having a thick package mold and ICs having a thin package mold on the same inserts, the tip of the latch portion 163a may interfere with the ICs at the time of loading thick ones. Although the interference can be prevented if a clearance between the latch portion and the upper surface of the ICs at the time of loading thick ICs is made to be a reference, the clearance becomes large for loading thin ICs and the solder balls HB may be out of the guide holes 191.

Figure 13:
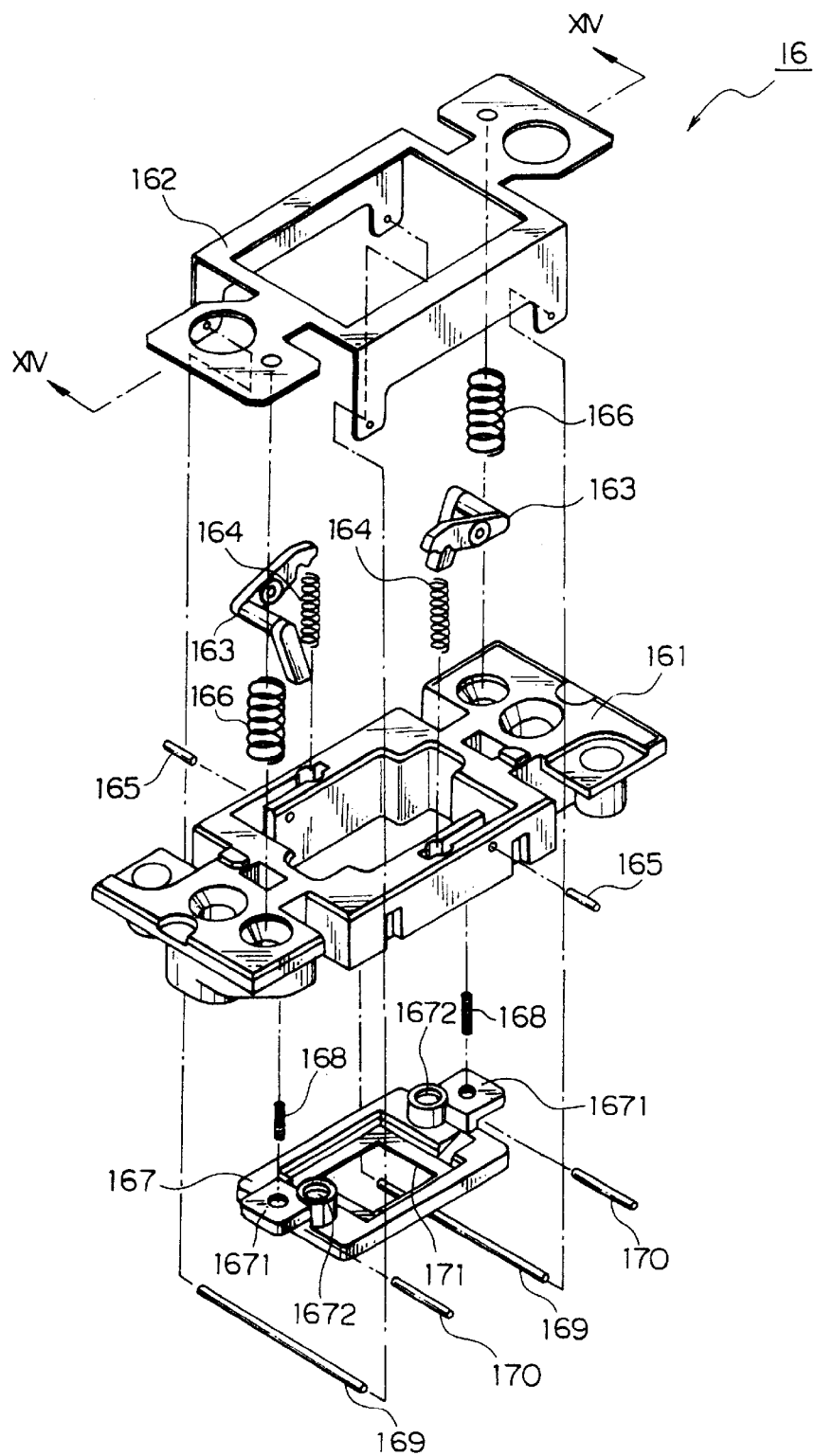
FIG. 13 is a disassembled perspective view of still another embodiment of the insert of the present invention.

The second embodiment below is capable of loading ICs of mainly difference thicknesses on same inserts. As shown in FIG. 13, in the present embodiment, a guide core 167 is provided at the center of the insert 16 on the insert body 161 via a pin 170. The pin 170 is attached the both ends to the insert body 161, comes in contact with a flange 1671 of the guide core 167 as shown in sectional views of FIGS. 14A to 14D, and prevents the guide core 167 from coming out. The guide core 167 is provided slightly movable three-dimensionally with respect to the insert body 161, in a so called floating state.

The guide core 167 is formed a guide hole 171 (a guide according to the present invention) formed by an opening, and the guide hole 171 is formed corresponding to the position of the solder balls HB of ball grid array type Ics to be tested. Note that the bottom surface of the guide core 167 is formed relatively wide so that the solder balls HB can smoothly fit in the guide hole 171 without any difficulties as far as the arrangement matrix of the solder balls HB of the ICs to be tested is the same even the size of the outer circumferential surface of the package molds are somewhat different.

The guide hole 171 shown in the same figure is configured to be an opening so that only solder balls HB on the outer-most circumference among the solder balls HB of the BGA type ICs fit in, however, a guide of the present invention can be considered to be a variety of forms other than the above in the same way as the guide holes 191 of the above first embodiment.

Also, two guide holes 1672 for fitting the guide pins of the suction heads of the above X-Y conveyer 304 in are provided on the guide core 167. When the guide pins of the suction heads fit in the guide holes 1672 of the guide core 167, positioning of the suction heads and the guide cores 167 is directly conducted regardless of a positional error of the insert body 161 and the test tray TST itself.

Note that the guide hole 1672 of the guide core 167 is made to be able to be fitted guide pins (not illustrated) of sockets in from below.

As to the latch mechanism 163, the same reference numbers are used and a detailed explanation will be omitted since the configuration is the same as that of the above first embodiment. In the present embodiment, however, two pins 169 are further provided on the lever plate 162, and the flange 1671 of the guide core 167 is placed on the pins 169 as shown in FIGS. 14A to 14D. Also, between the guide core 167 and the insert body 161 is provided a coil spring 168 for pushing the guide core 167 downward in FIGS. 14A to 14D. The relationship of a vertical movement of the lever plate 162, a vertical movement of the guide core 167 and an opening/closing movement of the latch mechanism 163 by the pins 169 and 170 and the coil spring 168 becomes as below.

Figure 14A:
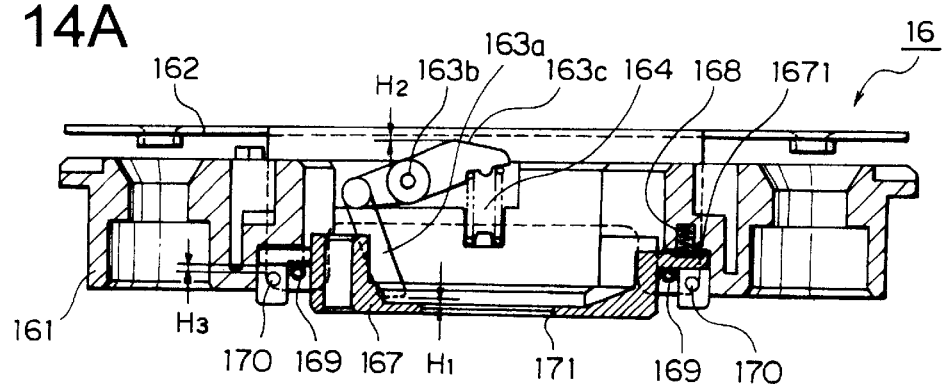
FIGS. 14A to 14D are sectional views along the line XIV—XIV in FIG. 13.

First, when no external force is acted on the insert 16, as shown in FIG. 14A, the lever plate 162 elevates with respect to the insert body 161, the latch mechanism becomes closed position thereby, and the guide core 167 becomes an elevated position by the pin 169. At this time, the clearance H between the latch portion 163a and the bottom surface of the guide core 167 becomes the smallest, and for example by setting the thickness of the thinnest IC at Hi, the latch portion 163a can surely hold ICs having a thicker thickness than that in a closed state and position deviation of the ICs can be prevented.

Figure 14B:
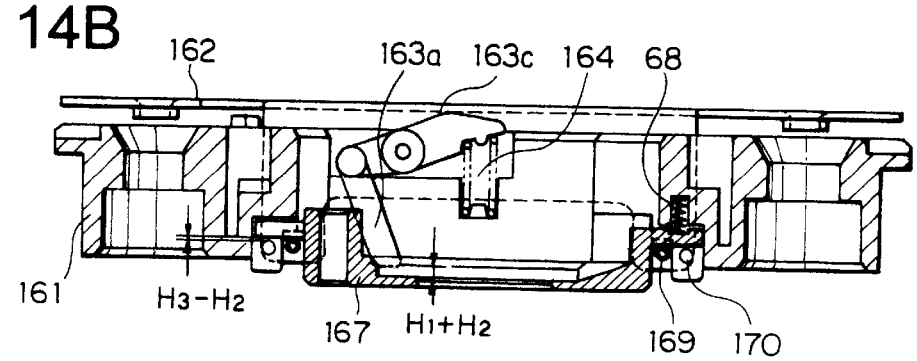
Figure 14C:
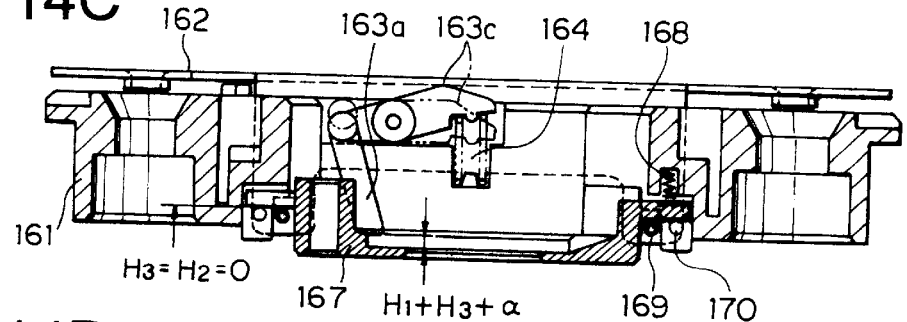
Figure 14D:
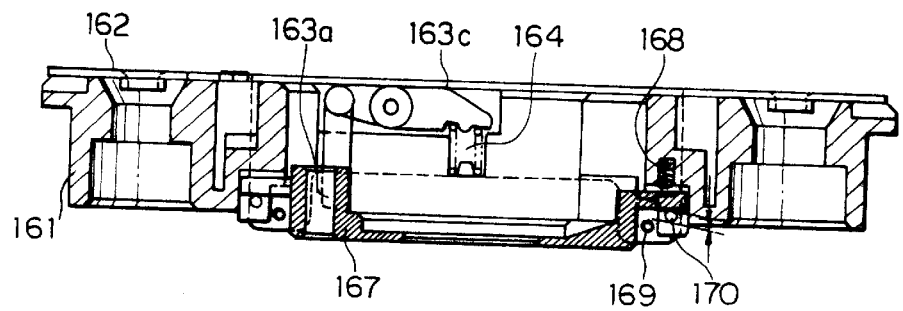

FIGS. 14B to 14D are gradually lowering states of the lever plate 162 from the state in FIG. 14A. First, since a clearance of H2 is set between the lever plate 162 and the point 163c to which a force is applied of the latch arm portion 163d, the latch mechanism does not operate until the I lever plate 162 lowers exactly for H2. On the other hand, because of support by the pin 169, the guide core 167 lowers exactly for H2 as the lever plate 162 lowers exactly for H2. The state where the lever plate 162 lowered for exactly H2 is shown in FIG. 14B. In this state, the clearance between the latch portion 163a and the bottom surface of the guide core 167 becomes H1+H2 from the initial H1.

When the lever plate 162 is further lowered, the point 163c on the latch arm portion is pushed down and the latch portion 163a start opening. Also, the guide core 167 continues to lower until the pin 169 comes to the same height as the pin 170. This state is shown in FIG. 14C.

As shown in FIG. 14D, when the lever plate 162 lowers to the lowest limit position, the latch portion 163a opens completely and the ICs can be carried out. Also the guide core 167 does not lower furthermore due to support by the pin 170.

Note that the operation at the time of loading ICs is opposite to this. As explained above, according to the insert 16 of the present embodiment, at the time of carrying out the ICs, after the guide core 167 lowers and a clearance between the ICs and the latch portion 163a is foamed, the latch portion 163a start opening, while inversely when loading ICs, after the latch portion 163a closes and moves to a position to cover on the upper surface of the ICs, the guide core 167 start elevating. Therefore, interference by the latch portion 163a with the ICs from the side does not occur and the same inserts 16 can be used for ICs having different thicknesses.

Figure 15:
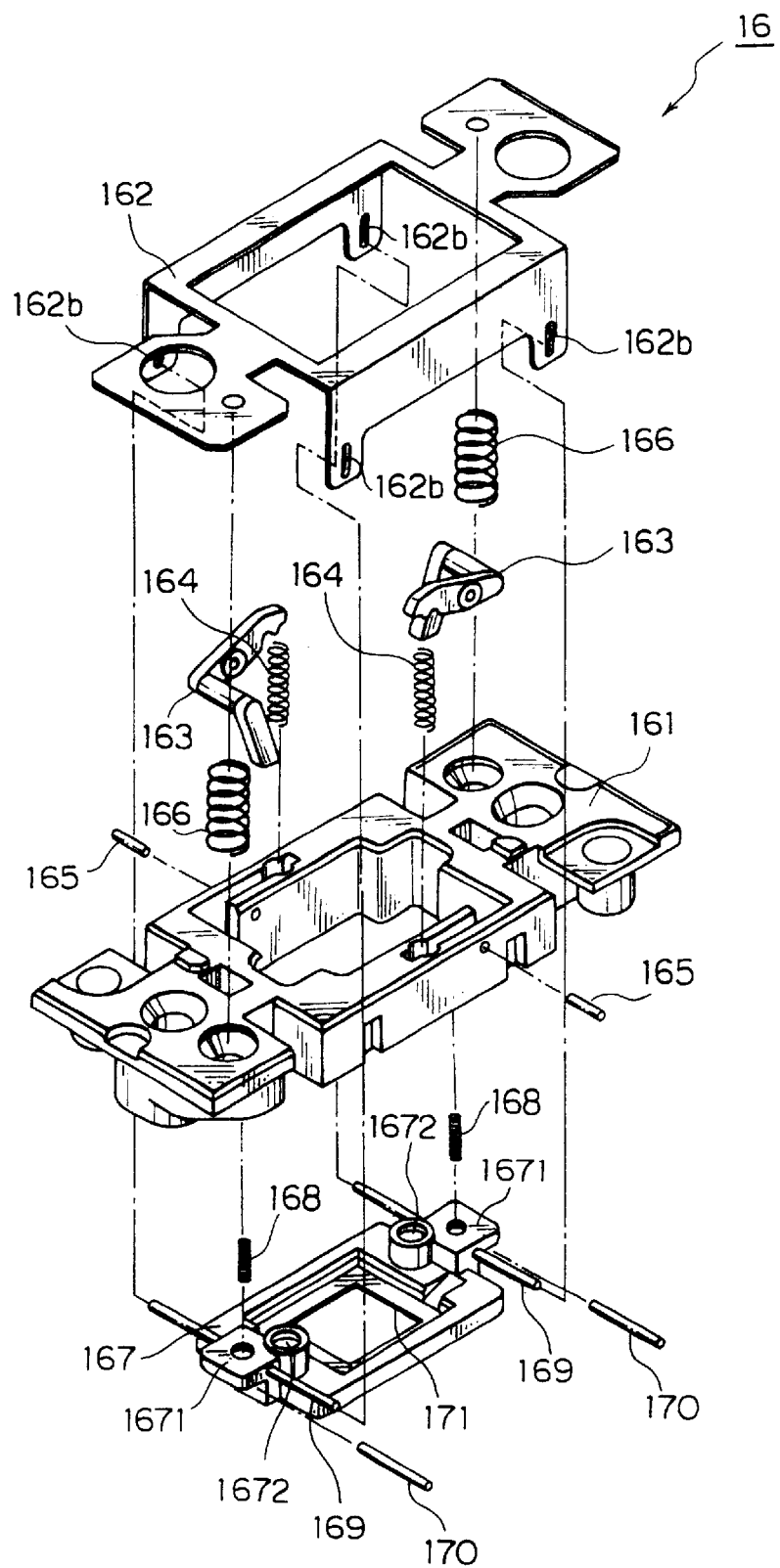
FIG. 15 is a disassembled perspective view of still another embodiment of the insert of the present invention.

The specific configuration of the guide core 161 according to the present invention is not at all limited by the one shown in FIG. 13 and a variety of forms other than that can be considered. For example, in another embodiment shown in FIG. 15, the pin 169 is pressed in the guide core 167 and the lever plate 162 is formed a long hole 162b.

Third Embodiment

Figure 16:
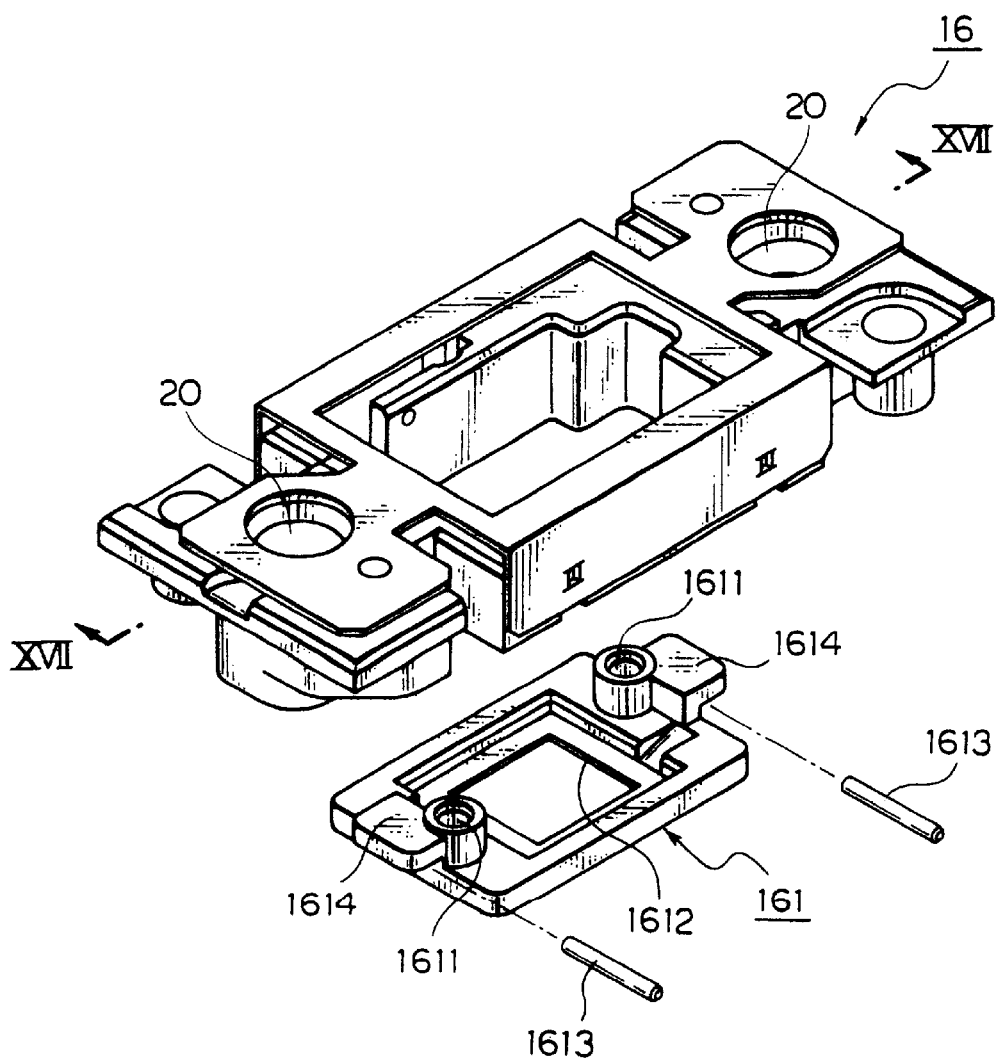
FIG. 16 is a disassembled perspective view of still another embodiment of the insert of the present invention.
Figure 17:
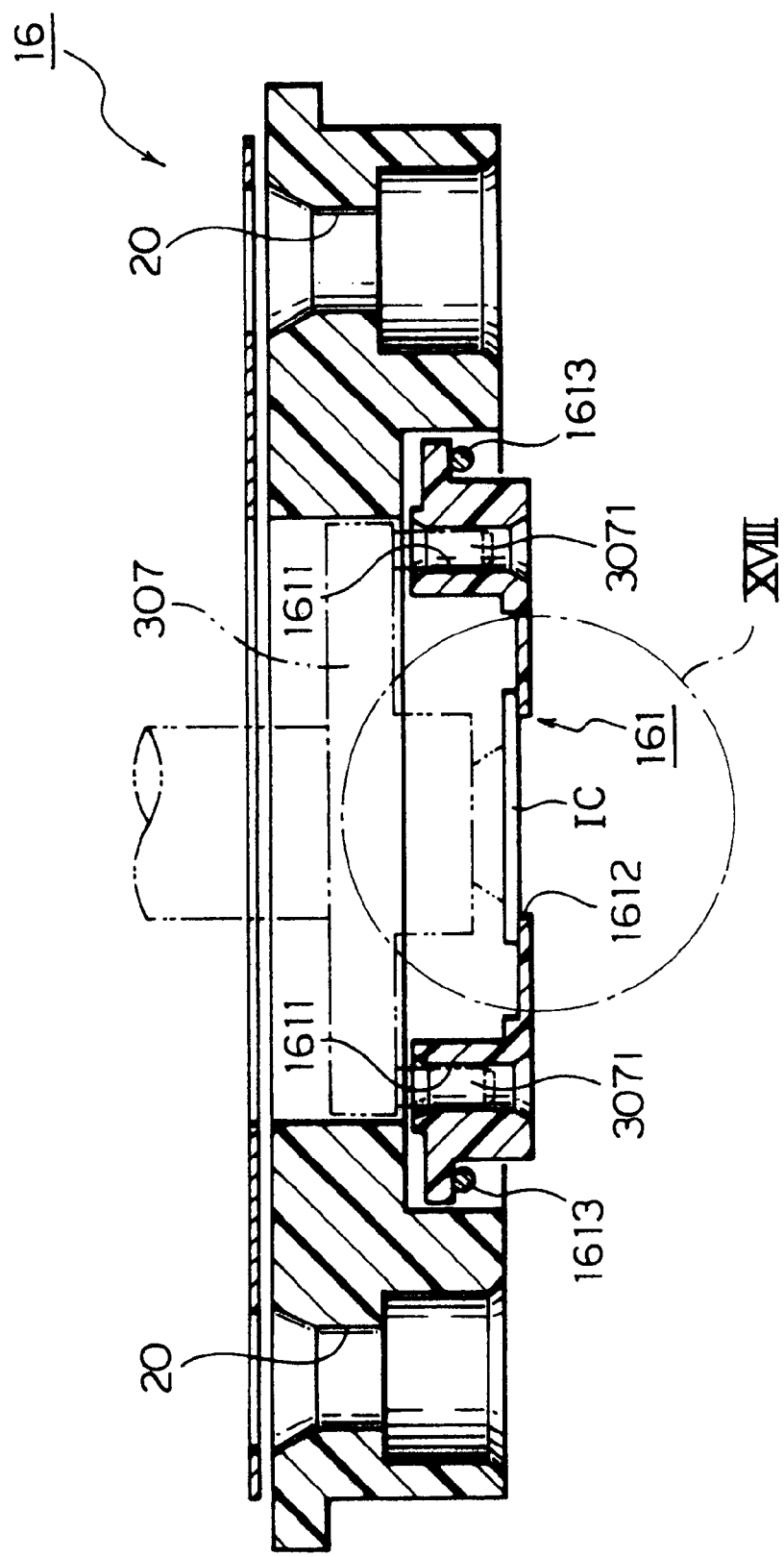
FIG. 17 is a sectional view along the line XVII—XVII in FIG. 16.

As shown in FIGS. 16 and 17, at the center of an insert 16 on an insert body is provided a guide core 161 via a pin 1613. The pin 1613 comes in contact with a flange 1614 of the guide core 161 as shown in a sectional view in FIG. 17 and it is only for preventing the guide core 161 from coming out. The guide core 161 is slightly movable three-dimensionally with respect to the insert body, in a so-called floating state.

Figure 18:
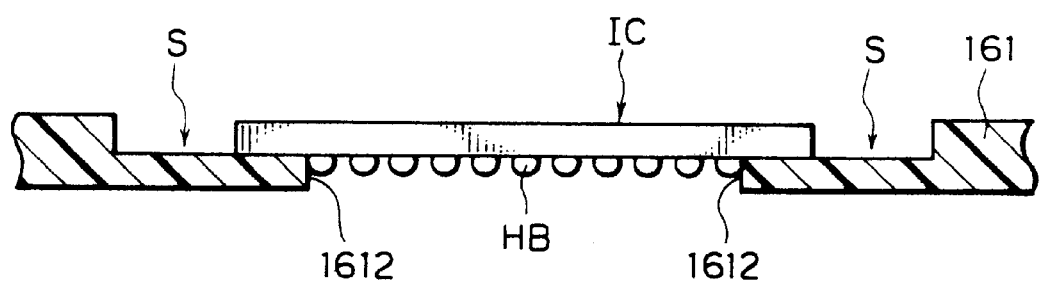
FIG. 18 is a sectional view of the enlarged XVIII portion in FIG. 17.

The guide core 161 is formed a guide hole 1612 (a guide according to the present invention) formed by an opening as shown in FIG. 18, and the guide hole 1612 is formed corresponding to the position of solder ball HB of a ball grid array type IC under test. Note that a small space S is formed on the bottom surface of the guide core 161 so that the solder balls HB can smoothly fit in the grade halls 1612 without any difficulties as far as the arrangement matrix of the solder balls HB of the ICs under test is the same even if sizes of the outer circumferential surfaces of the package mold PM are somewhat different.

The guide hall 1612 shown in the figure is configured as an opening so that only solder balls HB at the outer-most circumference among solder balls HB of BGA type :CCs fit in, however, various forms other than that may be considered as a first guide of the present invention.

Figure 25A:
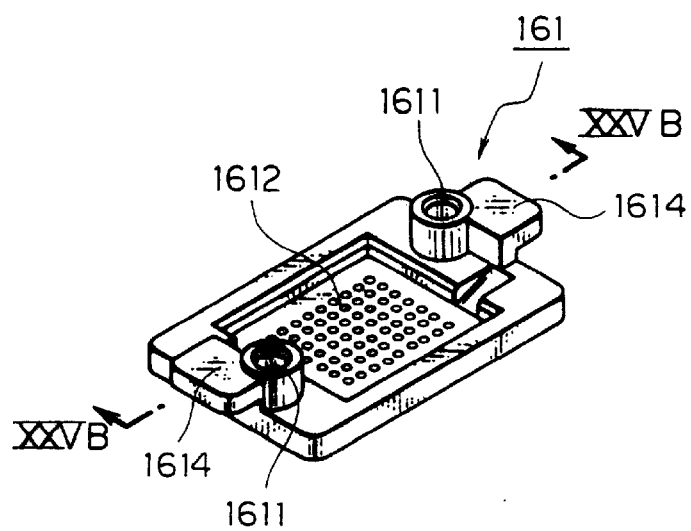
FIG. 25A is a perspective view of another embodiment of a guide core according to the present invention.
Figure 25B:
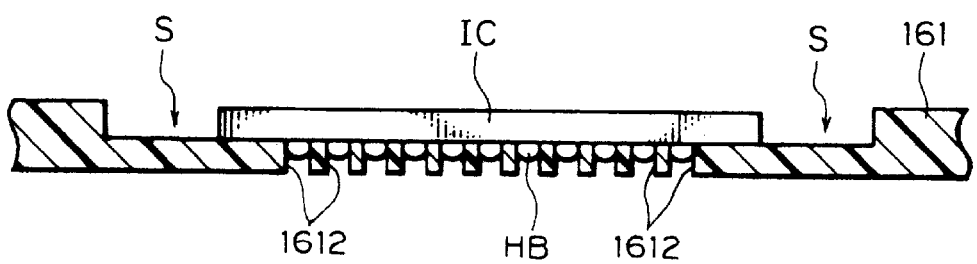
FIG. 25B is a sectional view along the line XXVB—XXVB in FIG. 25A.

Another embodiment shown in FIGS. 25A and 25B is an example wherein the guide holes 1612 for all solder balls HB of the BGA type ICs to fit in are provided on the bottom surface of the guide core 161 and made to be through holes so that the contact pins 51 can contact all the solder balls HB from the lower side.

Figure 26A:
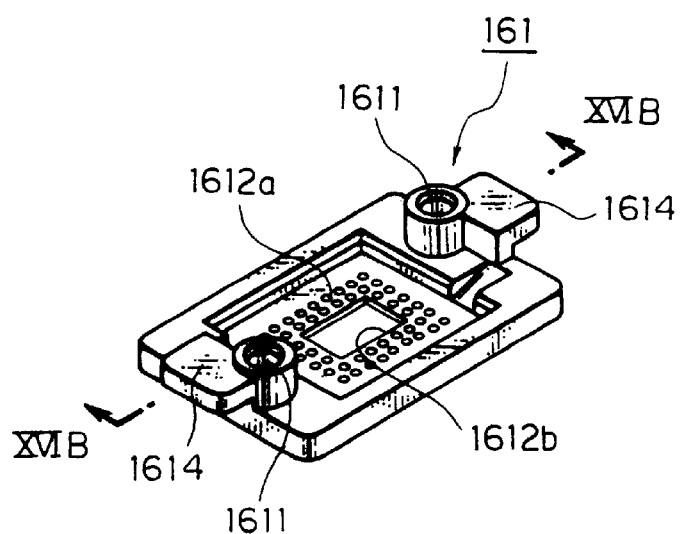
FIG. 26A is a perspective view of still another embodiment of the guide core according to the present invention.
Figure 26B:
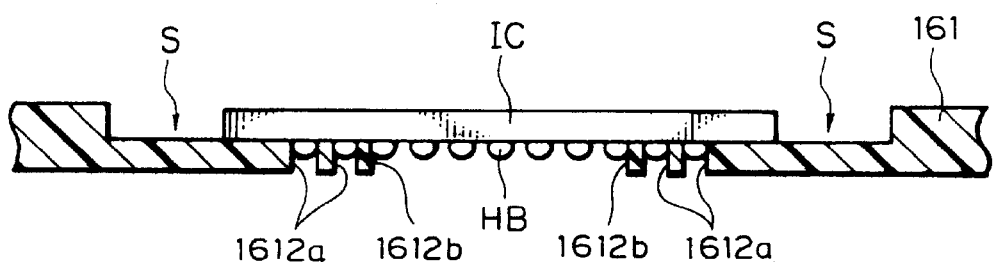
FIG. 26B is a sectional view along the line XXVIB—XXVIB in FIG. 26A.
Figure 27:
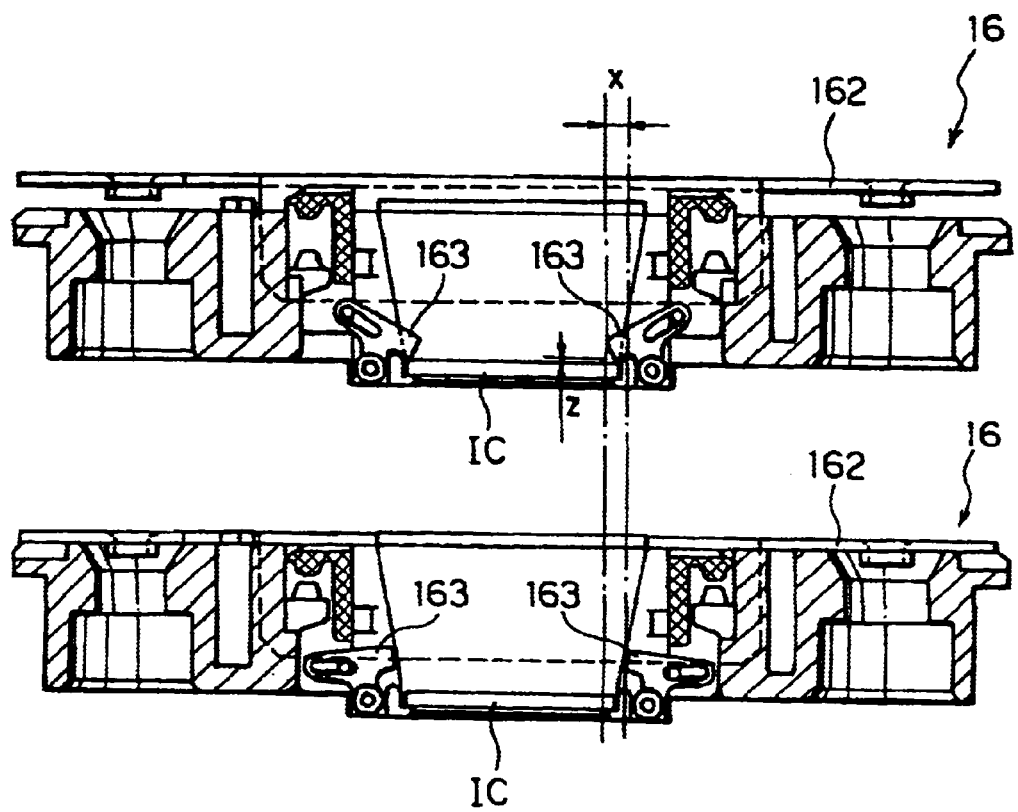
FIG. 27 is a sectional view of an insert of the related art.
Figure 29:
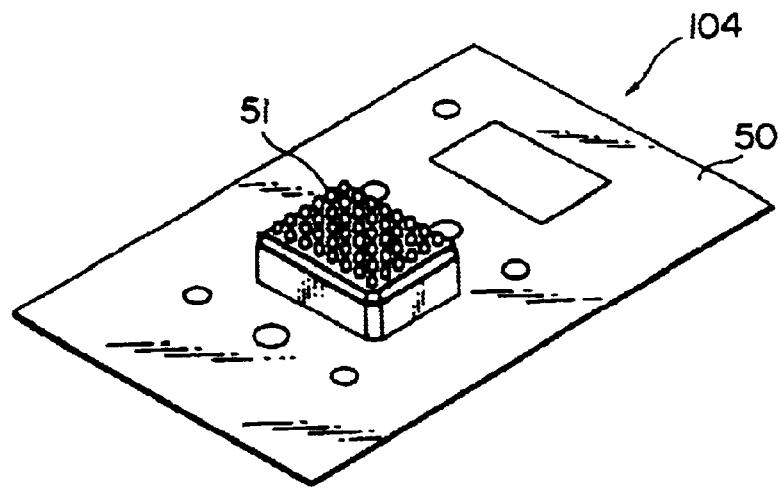
FIG. 29 is a perspective view of a general contact pin (socket)
Figure 30:
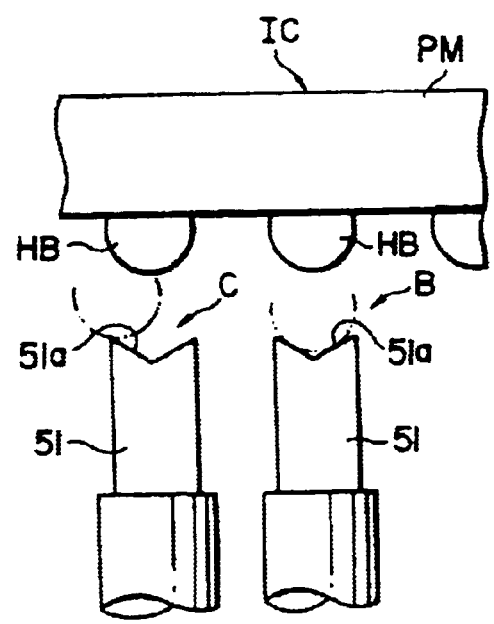
FIG. 30 is a sectional view of a core portion showing a contact condition of a ball terminal of an IC and a contact pin.

Also, another embodiment shown in FIGS. 26A and 26B is an example wherein the guide holes 1612a to which only solder balls HB on two rows from the outside among the solder balls of BGA type ICs fit in are provided on the bottom surface of the guide core 161, and an opening 1612b is formed at the center of the bottom surface of the guide core 161 so that the contact pins 51 can contact the remaining solder balls.

Also, two guide holes 1611 (corresponding to a second and third guide pins according to the present invention) for fitting the guide pins 3071 of the above suction heads 307 are provided on the guide core 161. When the guide pins 3071 of the suction heads 307 are fit in the guide holes 1611 of the guide core 161, positioning of the suction heads 307 and the guide cores 161 is directly conducted regardless of a positional error of the insert body and the test tray TST itself.

Note that the guide holes 1611 of the guide core 1611 are made to be able to be fitted guide pins 52 (see FIG. 19 or FIG. 20) of sockets in from below. Namely, the guide hole 1611 also composes a third guide according to the present invention.

The specific configuration of the guide core 161 according to the present invention is not at all limited to the one shown in FIG. 16 and a variety of forms other than that can be considered.

Figure 21:
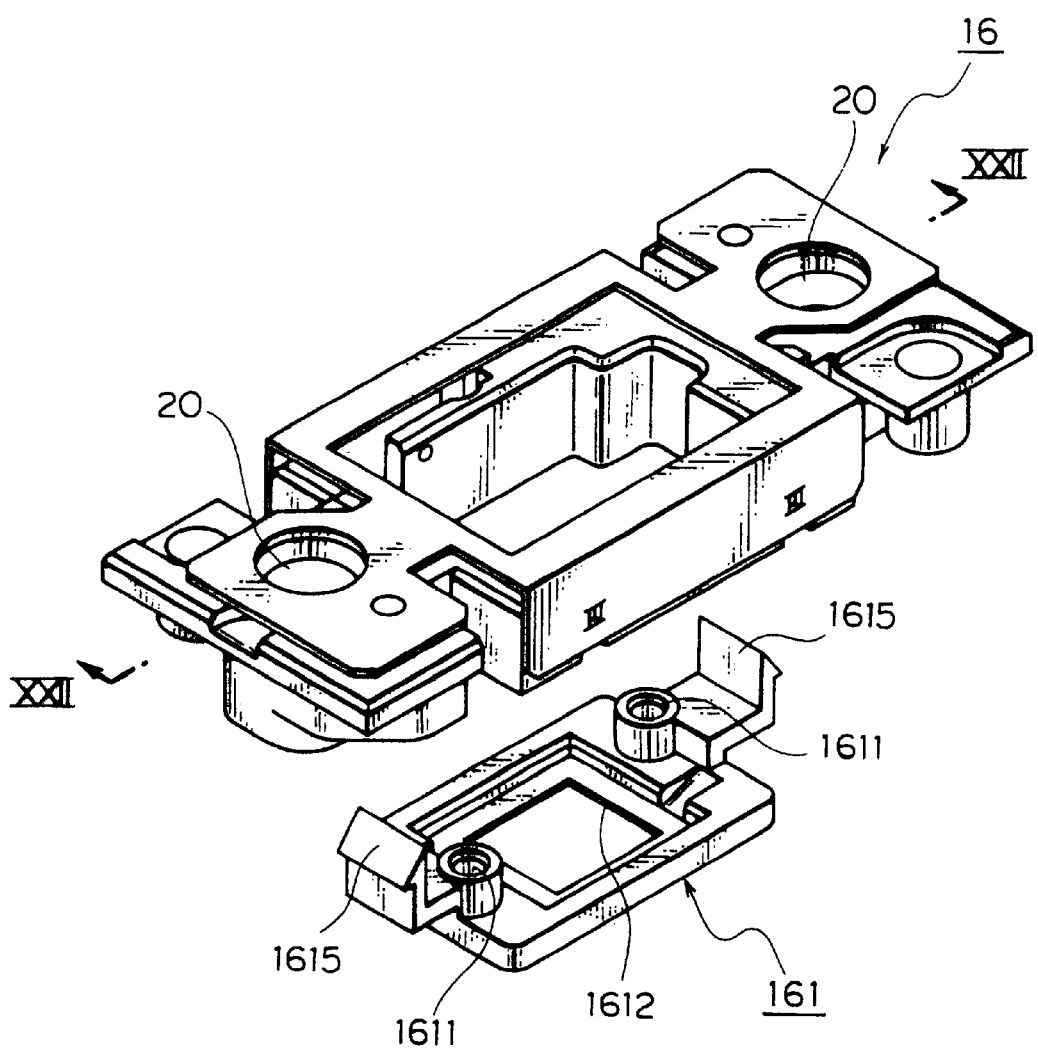
FIG. 21 is a disassembled perspective view of still another embodiment of the insert of the present invention.
Figure 22:
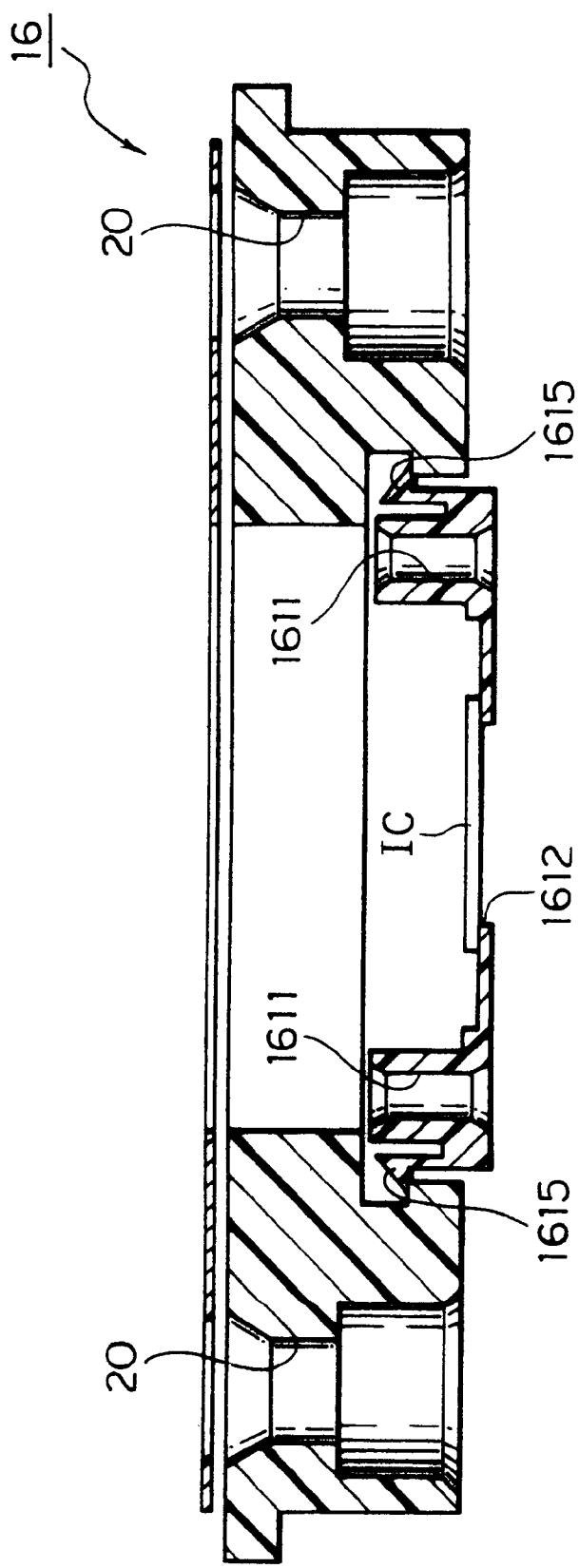
FIG. 22 is a sectional view along the line XXII—XXII in FIG. 21.

In another embodiment shown in FIGS. 21 and 22, pins 1613 are not used and a hook 1615 having a flexibility is formed on the guide core 161 instead, and the hook 1615 is fit in the insert body in the present example, the guide core 161 is made slightly movable three-dimensionally with respect to the insert body, provided in a so called floating state.

Figure 23:
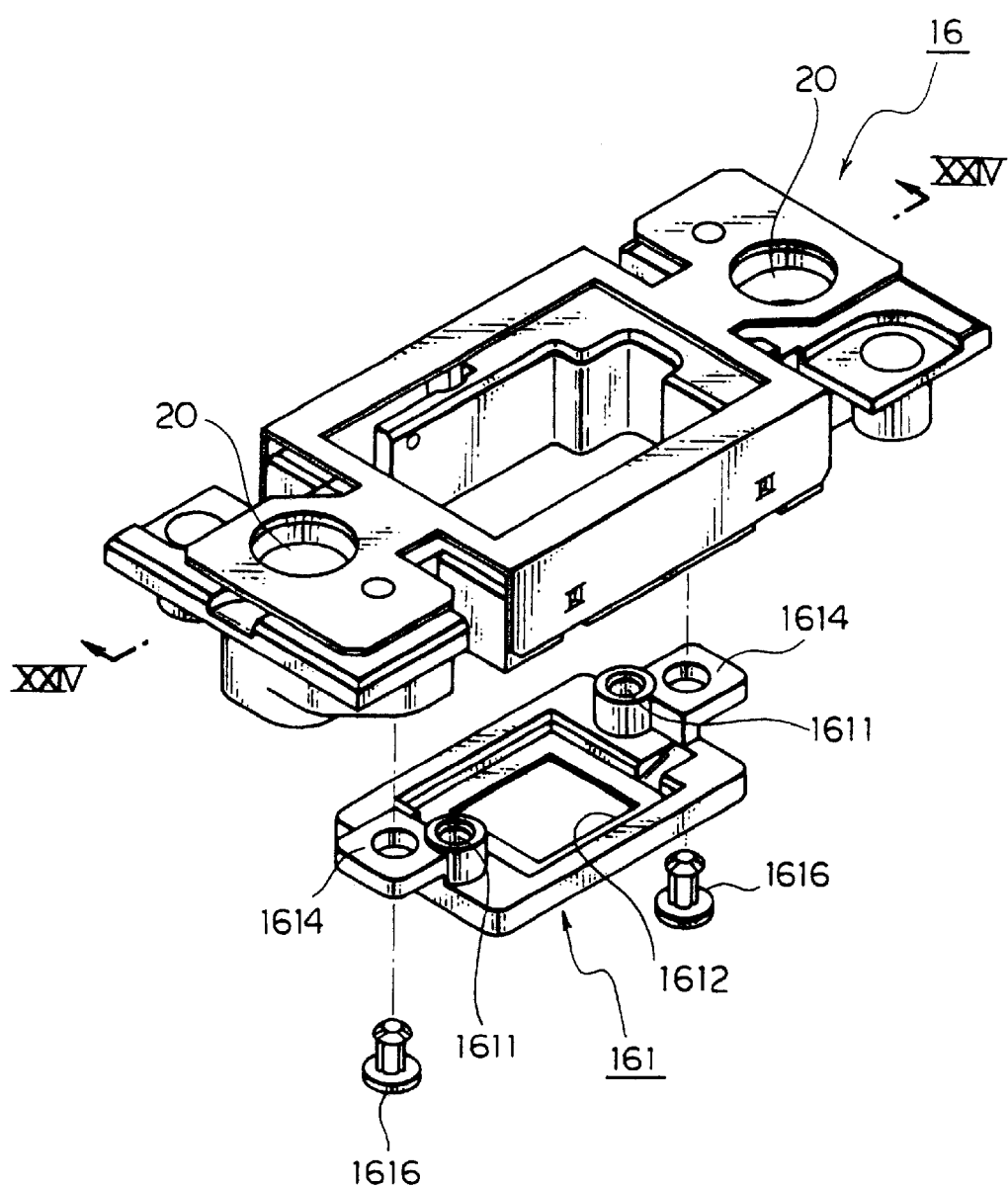
FIG. 23 is a disassembled perspective view of still another embodiment of the insert of the present invention.
Figure 24:
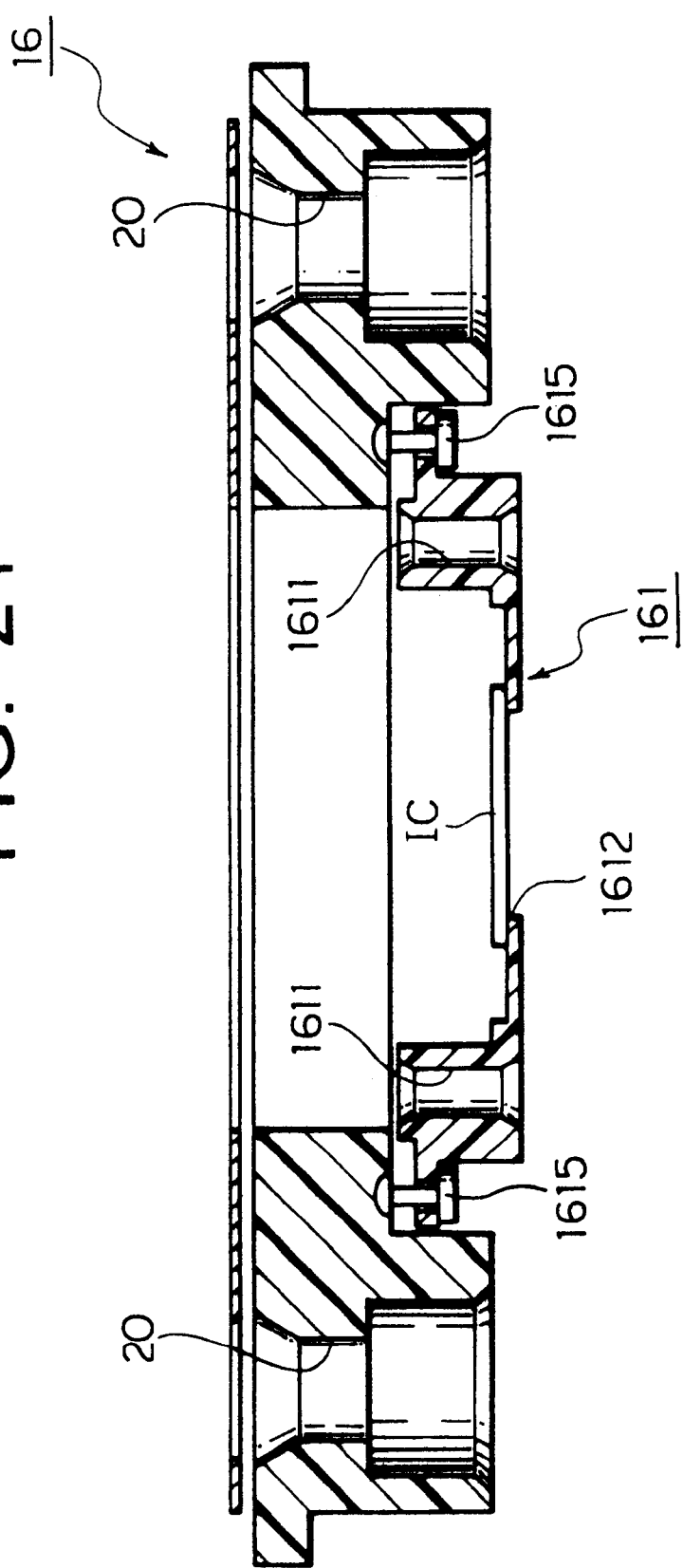
FIG. 24 is a sectional view along the line XXIV—XXIV in FIG. 23.

Furthermore, in another embodiment as shown in FIGS. 23 and 24, a tap pin 1616 is used instead of the pin 1613. In this example also, by considering a size of the tap pin 1616, the guide core 161 is made slightly movable three-dimensionally with respect to the insert body, provided in a so-called floating state.

Figure 20:
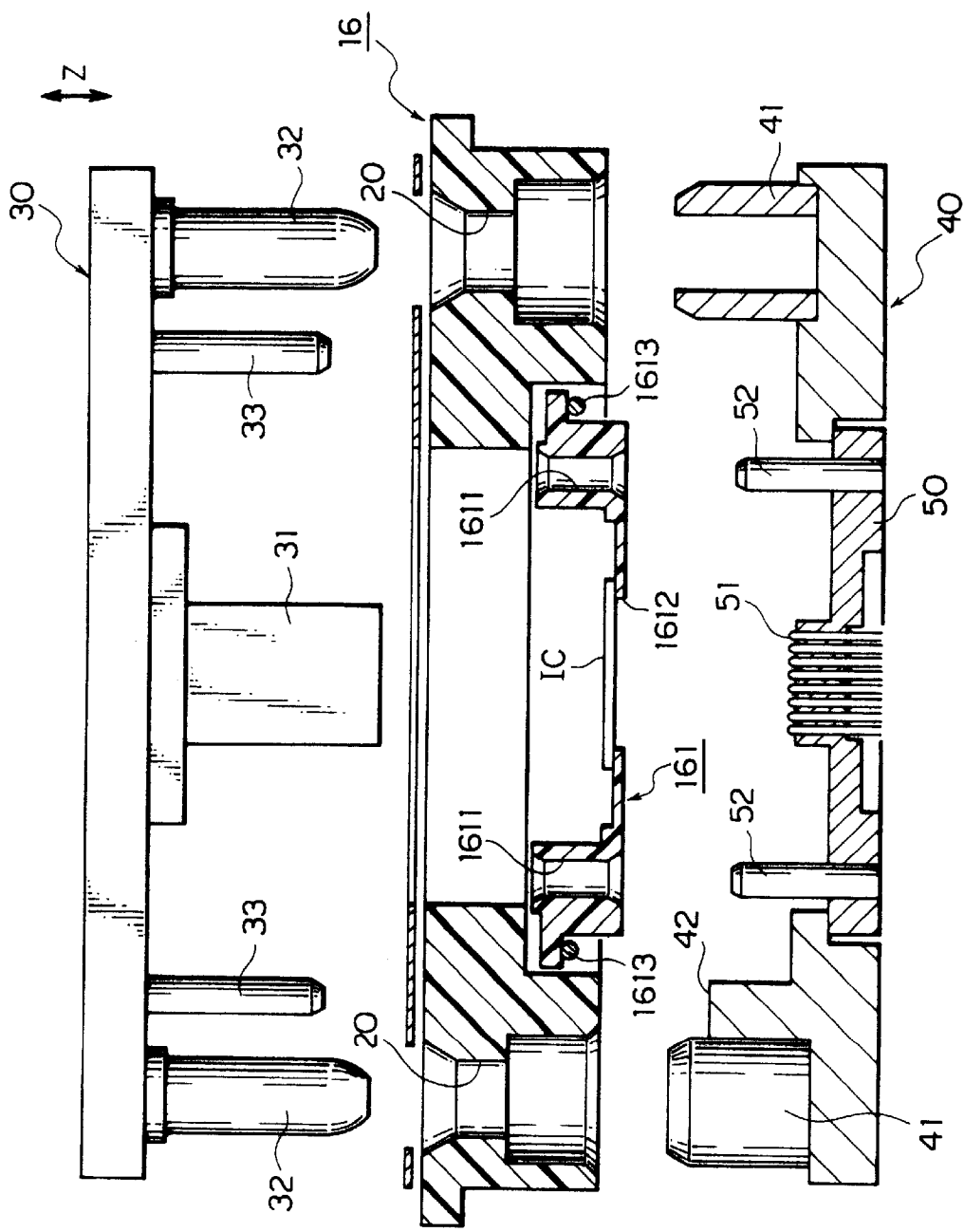
FIG. 20 is a sectional view of the configuration of a pusher, insert, socket guide and contact pin in the test head in FIG. 1.

FIG. 20 is a sectional view of the configuration of a socket 50 comprising a socket having a pusher 30, insert 16 (on the test tray TST side), socket guide 40 and contact pin 51 in the test head 104 of the electric devices testing apparatus, wherein the pushers 30 are attached on the upper side of the test head 104 and moves vertically in the Z-axis direction by a not shown Z-axial drive (for example a fluid pressure cylinder). The pushers 30 are attached to the Z-axial drive corresponding to the intervals of the ICs to be tested at one time (in the above test tray, total sixteen of four rows every four columns).

A pusher 30 has formed at its center a rod 31 for pushing the IC. It is provided at its two sides with guide pins 32 to be inserted into guide holes 20 of the insert 16 mentioned later and the guide bushes 41 of the socket guide 40. Further, between the rod 31 and the guide pins 32 is provided a stopper guide 33 for limiting the descent of the pusher 30 by the Z-axial drive as a lower limit. This stopper guide 33 abuts against the stopper surface 42 (only one side is shown) of the socket guide 40 to determine the lower limit position of the pusher 30 for pushing by a suitable pressure not breaking the IC.

The insert 16, as explained with reference to FIG. 5, is attached to the test tray TST using a fastener 17. It is formed at its two sides with guide holes 20 through which i the above-mentioned guide pins 32 of the pusher 30 and the guide bushes 41 of the socket guide 40 are inserted. In the state of descent of the pusher 30, the guide hole 20 at the left side in the figure is made a small diameter at its upper half where the guide pin 32 of the pusher 30 is inserted for positioning and is made a large diameter at its lower hole where the guide bush 41 of the socket guide 40 is inserted for positioning. Note that the guide hole 20 at the right side in the figure fits with play with the guide pin 32 of the pusher 30 and the guide bush 41 of the socket guide 40.

On the other hand, the socket guide 40 fixed to the test head 104 is provided at its two sides with guide bushes 41 for insertion of the two guide pins 32 of the pusher 30 and positioning with these two guide pins 32. The guide bush 41 at the left side also performs positioning with the insert 16.

At the lower side of the socket guide 40 is fixed a socket 50 having a plurality of contact pins 51. These contact pins 51 are biased in the upward direction by not shown springs. Therefore, even if pushing a IC, the contact pins 51 will retract to the top surface of the socket 50. On the other hand, it is possible for the contact pins 51 to contact all of the terminals HB even if the ICs are pushed somewhat at an angle. Note that at the ends of the contact pins 51 are formed substantially conical indentations 51a for receiving the solder balls HB of a ball grid array type IC (see FIG. 28).

Also, the socket 50 is separately, provided with guide pins 52 to fit in the guide holes 1611 of the guide core 161 mounted to the insert 16 in a floating state. When the pusher 30 lowers and the insert 16 also lowers, the guide core 161 is positioned by a guide pin 52 regardless of existence of a positional error of the insert 16, as a result, the positioning of the ball terminals HB of the ICs and the contact pins 51 can be performed accurately.

Figure 19:
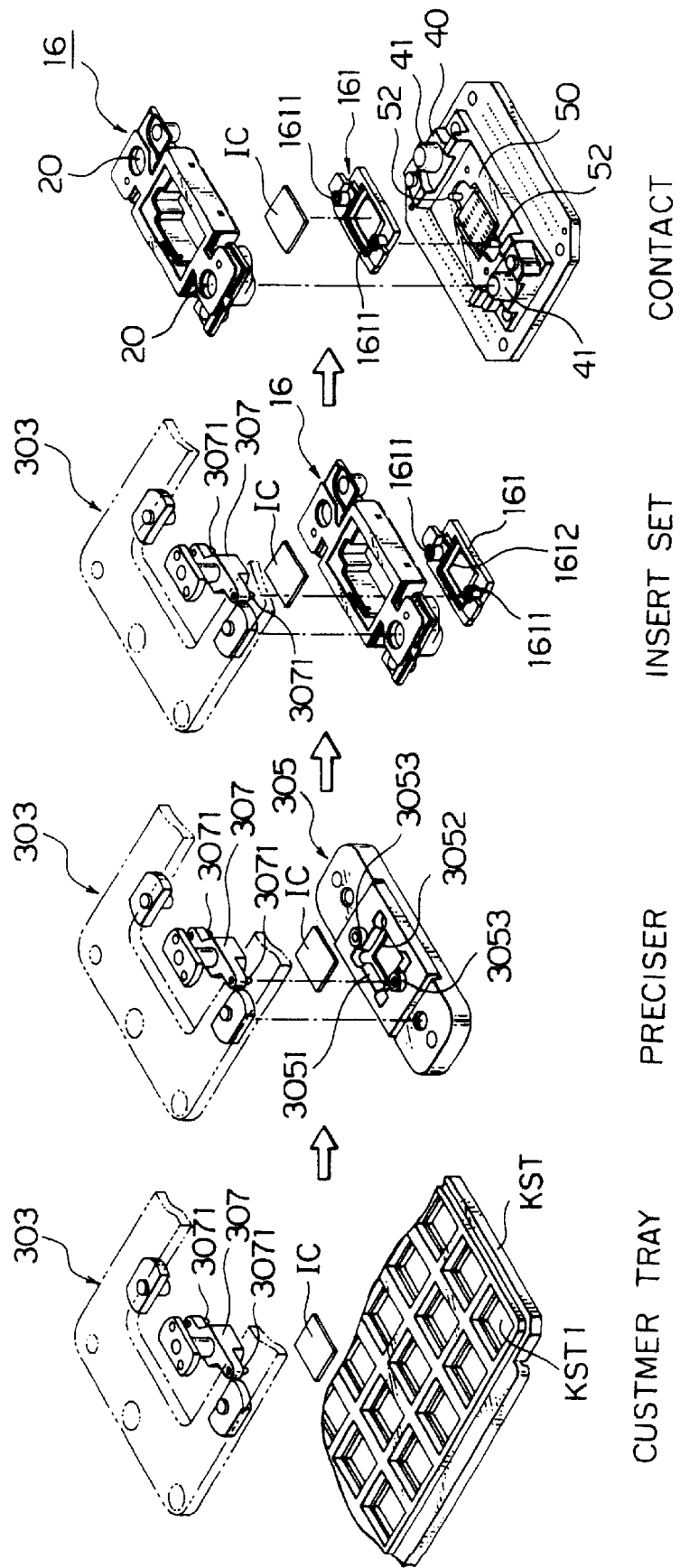
FIG. 19 is a perspective view of a core portion for explaining a method of reloading electric devices in the electric devices testing apparatus in FIG. 1.

Next, an operation will be explained with reference mainly to FIG. 19.

First, a customer tray KST fully loaded with pre-test ICs is conveyed from the IC stocker 201 to an opening portion 306 of the loader section 300, where the ICs are reloaded by the X-Y conveyer 304 to a preciser 305 by eight at a time. In a state of loaded on the customer tray KST, positions of the ICs are extremely rough. The suction heads 307 of the X-Y conveyer 304 pick up the ICs and drop to the preciser 305. In the preciser 305, positions of the ICs are determined relatively accurately by indentations 3051 in accordance with the outer circumferential shape of the package of the ICs, and as a result that the openings 3052 formed on the bottom surface of the indentations 3051 guide the ball terminals HB of the ICs, positions of the IC terminals with respect to the preciser 305 are correctly decided.

Next, the same X-Y conveyer 304 is used for picking up the positioned ICs, but at this time, by fitting the guide pins 3071 of the suction heads 307 in the guide holes of the preciser 305, the positional relationship of the suction heads 307 and the preciser 305 is accurately decided, so the ICs are picked up by the suction heads 307 accurately.

The movable arm 302 and the movable head 303 of the X-Y conveyer 304 are operated in this state and the ICs are conveyed to one insert 16 of the test tray TST. Then, by lowering the suction heads 307 to fit the guide pins 3071 in the guide holes 1611 of the guide core 161 of the insert 16, the suction heads 307 and the guide cores 161 are correctly positioned, and the ICs are released in this state. Due to this, the solder balls HB of the ICs fit in the guide holes 1612 of the guide cores 161.

When conveying ICs to all of the inserts 16, the test tray TST is conveyed to the test procedure in the chamber section 100. In the test procedure, the ICs to be tested are conveyed above the test head in a state carried by the test tray TST shown in FIG. 5, more precisely, each of the ICs under test is in a state of being dropped in the guide core of the insert 16 in the figure.

When the test tray TST stops at the test head 104, the Z-axial drive starts operating and one pusher 30 shown in FIG. 20 lowers so as to correspond to one insert. Then two guide pins 32, 32 of the pusher 30 penetrate the guide holes 20, 20 of the insert 16 and fit in the guide bushes 41, 41 of the socket guide 40. As a result, the guide pin 52 provided on the socket 50 fits in the guide hole 1611 of the guide core 161.

Here, although the insert 16 and the pusher 30 has a positional error to some extent with respect to the socket 50 and the socket guide 40 fixed on the test head 104 (namely, on the electric device side), positioning of the pusher 30 and the insert 16 is performed by fitting the guide pin 32 on the left side of the pusher 30 in the small diameter hole of the guide hole 20. As a result, the rods of the pusher 30 can push the IC to be tested at an appropriate position.

Also, by fitting the guide bush 41 on the left side of the socket guide 40 in the large diameter hole of the guide hole 20 on the left side of the insert 16, positioning of the insert 16 and the socket guide 40 is performed, consequently, positional accuracy of the ICs to be tested and the contact pins.51 is improved.

Particularly in the present embodiment and in other modified examples, as shown in FIG. 20, the solder ball HB itself of the IC under test is positioned by a guide hole 1612 of the guide core 161 of the insert 16, and moreover, the guide core 161 and the socket are positioned by the guide pin 52 and the guide hole 1611, so the positioning of the solder ball HB and the contact pin 51 can be realized at a high precision.

As explained above, since positioning accuracy of the solder ball HB of the IC to be tested and the contact pin 51 is sufficiently attained, without any other positioning, the stopper guide 33 further lowers the pusher 30 until it abut the stopper surface 42 and the IC to be tested is made contact the contact pin 51 by the rod 31. It is stopped in this state and a predetermined test is conducted.

Note that the embodiments explained above were described to facilitate the understanding of the present invention and not to limit the present invention. Accordingly, elements disclosed in the above embodiments include all design modifications and equivalents belonging to the technical field of the present invention.

What is claimed is:

1. An insert provided in a slightly movable state on a tray and loaded with electric devices to be tested inside an electric devices testing apparatus, the insert comprising:

a latch portion for moving between a first position and a second position, the first position for holding the electric devices under test in said insert by covering over an upper surface of the electric devices with a clearance to prevent the electric devices from jumping out, and the second position for receding from the upper surface of said electric devices under test; and a latch arm portion for rotatably supporting said latch portion on an insert body;

wherein a tip of said latch portion and a rotation center of said latch arm portion are arranged at the first position in an approximately vertical line crossing the upper surface of the electric devices being held in the insert in a view from a side of said insert, wherein said latch portion and the rotation center of said latch arm portion are offset from each other in a plan view of said insert.

2. The insert as set forth in claim 1, comprising an elastic body for biasing said latch arm in a moving direction of said latch portion to a holding position.

3. The insert as set forth in claim 1, wherein a point to which a force is applied on said latch arm portion is provided on an opposite side of said latch portion with respect to the rotation center of the latch arm portion, said force being an external force acting on said point via a lever plate provided on said insert body.

4. The insert as set forth in claim 1, wherein a point on said latch arm portion is provided on an opposite side of said latch portion with respect to the rotation center of the latch arm portion, said force being an external force directly acting on said point.

5. The insert as set forth in claim 1, wherein a terminal of said electric devices under test is a ball-shaped terminal.

6. The insert as set forth in claim 5, comprising a guide for positioning the terminal of said electric devices under test.

7. The insert as set forth in claim 5, wherein said guide is a hole into which said ball-shaped terminal fits.

8. The tray having the insert as set forth in claim 1, wherein the tray is for carrying the electric devices under test to and from a contact portion of a test head of the electric devices testing apparatus.

9. The electric devices testing apparatus having a tray as set forth in claim 8, wherein electric devices testing apparatus is for conducting a test by pushing terminals of the electric devices under test against the contact portion of the test head.

* * * * *